(12) United States Patent
Yamamoto et al.

(10) Patent No.: US 6,716,572 B2
(45) Date of Patent: Apr. 6, 2004

(54) MANUFACTURING PROCESS FOR PRINTED WIRING BOARD

(75) Inventors: Takuya Yamamoto, Ageo (JP); Takashi Kataoka, Ageo (JP); Yutaka Hirasawa, Ageo (JP); Naotomi Takahashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/082,154

(22) Filed: Feb. 26, 2002

(65) Prior Publication Data
US 2002/0081530 A1 Jun. 27, 2002

(51) Int. Cl.[7] .............................. G03F 7/00; G03F 7/26
(52) U.S. Cl. ...................... 430/318; 430/311; 430/313; 430/314; 430/945
(58) Field of Search ................................ 430/311, 313, 430/314, 318, 945

(56) References Cited

U.S. PATENT DOCUMENTS

| 3,734,616 | A | * | 5/1973 | Mayhew et al. | ............... 355/89 |
| 3,833,433 | A | * | 9/1974 | Caule | ........................... 216/20 |
| 4,025,358 | A | * | 5/1977 | Kossler | ........................ 134/3 |
| 6,319,620 | B1 | * | 11/2001 | Kataoka et al. | ............. 428/626 |
| 2002/0081530 | A1 | * | 6/2002 | Yamamoto et al. | ......... 430/313 |
| 2002/0192486 | A1 | * | 12/2002 | Chen et al. | .................. 428/607 |
| 2003/0148136 | A1 | * | 8/2003 | Yamamoto et al. | ......... 428/607 |

FOREIGN PATENT DOCUMENTS

| EP | 1 097 806 | * | 5/2001 | ............ B32B/15/08 |
| JP | 11-186678 | * | 7/1999 | ............ H05K/1/03 |
| JP | 2001-239386 | * | 9/2001 | ............ B23K/26/00 |
| JP | 2001-262372 | * | 9/2001 | ............ C23C/30/00 |
| JP | 2001-308544 | * | 11/2001 | ............ H05K/3/46 |
| JP | 2001-347599 | * | 12/2001 | ............ B32B/15/08 |

* cited by examiner

*Primary Examiner*—Mark F. Huff
*Assistant Examiner*—Nicole Barreca
(74) *Attorney, Agent, or Firm*—Rothwell Figg Ernst & Manbeck

(57) ABSTRACT

It is an object to provide a manufacturing process for a printed wiring board in which a copper foil and resin as a substrate material of a copper clad laminate are irradiated with carbon dioxide gas laser light to drill in both of them simultaneously. In forming a through hole or a hole such as IVH, BVH or the like in the copper clad laminate using carbon dioxide gas laser light, one of a nickel layer of 0.08 to 2 μm in thickness, a cobalt layer of 0.05 to 3 μm in thickness and a zinc layer of 0.03 to 2 μm in thickness is formed as an additional metal layer on a surface of the copper foil residing in an external layer of the copper clad laminate and thereafter, by performing laser drilling, the copper foil layer and the resin layer as a substrate material of the copper clad laminate are enabled to drill simultaneously.

11 Claims, 11 Drawing Sheets

MANUFACTURING PROCESS FOR PRINTED WIRING BOARD

FIELD OF THE INVENTION

The present invention relates to a manufacturing process for a printed wiring board. Particularly, the present invention relates to a manufacturing process for a printed wiring board performing drilling by carbon dioxide laser.

BACKGROUND ART

Precise drilling has been performed, heretofore, to form a through hole (PHT) in a printed wiring board, but because of today's built-up demands for high density circuit formation and high density mountability on a printed wiring board, microfabication has become required for a through hole or a hole such as IVH, BVH, a marker hole or the like in a field of a multilayer printed wiring board with three layers or more.

With such a change in requirements of the market for a printed wiring board, a drilling technique using laser light such as of carbon dioxide gas laser, YAG laser or the like has been developed as an alternative to the drilling technique.

On a surface of a copper clad laminate for use in manufacture of a printed wiring board, however, a copper foil forming a conductor circuit is present and a surface of the cooper foil is called a shiny side and has an arithmetic mean roughness (Ra) of the range from 0.01 to 0.3 $\mu$m; therefore, the surface thereof is mirror-finished in a similar level to that polished. Consequently, even when the copper foil surface is irradiated with carbon dioxide gas laser light, a reflectance of the laser light thereby is high; thus having resulted in not only impossibility of machining to a desired shape on the copper clad laminate with carbon laser light in a short time, in the presence of a copper foil at a surface of a copper clad laminate, but also difficulty in application of the machining to actual operation.

Therefore, laser machining applied on a copper clad laminate has been adopted in the case where carbon laser light is applied in conformal mask lithography in which only portions of a copper foil thereon where a through hole or a hole such as IVH, BVH, a marker hole is drilled are removed by etching in advance, followed by laser irradiation drilling.

The conformal mask lithography process, however, has a fault that since portions of a copper foil at drilling positions are removed by etching prior to laser drilling, extra steps otherwise unnecessary are added, such as etching resist formation, exposure, developing, copper etching, etching resist removal and others, having resulted in a factor to raise a manufacturing cost for a printed wiring board.

In the case where carbon dioxide gas laser is adopted, studies have been conducted, in order to solve the fault of the conformal mask lithography process, on a technique enhancing an absorbance of laser light on a surface of a copper foil of a copper clad laminate to remove a copper foil and resin as a substrate material simultaneously in a short time, having tried various other measures, that is, having applied so-called black oride treatment on the surface of a copper foil of a copper clad laminate, or having provided a resin layer with high laser light absorption efficiency thereon with an intention to enhance laser light absorption efficiency on the surface of a copper foil of a copper clad laminate.

Assume the case where the so-called black oring treatment is applied on the surface of a copper clad laminate. However, the black oring treatment, in essence, is a process performed after a through hole or a hole such as IVH, BVH or the like is formed and then interlayer connection copper plating is performed, followed by forming a circuit through etching, and is to be applied on an internal substrate material of a multilayer substrate. Therefore, there is difficulty in application to a copper foil as an external layer of a printed wiring board.

On the other hand, a process for providing a resin layer with a high laser light absorption efficiency on a surface of a copper foil is a process that a film constituting a resin layer is laminated on a surface of a copper clad laminate or a process that a liquid resin composition is applied on the surface of a copper clad laminate and cured. In the case of adoption of the laminating process, a necessity arises for introduction of a high precision apparatus for stable laminating, unpreferably resulting in cost increase. In the case where a resin composition is applied in a liquid state to thereafter cure as well, a necessity arises for facilities such as a curing oven and others, which requires a significant capital investment, thereby pushing up a product cost as a result. Furthermore, a material constituting a resin layer is an organic agent and almost cannot be recycled, which cannot be said to be preferable from the viewpoint of protection of the natural environment.

SUMMARY OF THE INVENTION

The inventors of the present invention have carried out serious studies with the result that only with slight improvement on a prior art etching process, a copper clad laminate acquires a state where by applying carbon dioxide gas laser thereto, a copper foil layer and a resin layer as a substrate material can be simultaneously removed into a desired shape, thereby enabling continuity in manufacturing a printed wiring board. Note that in the present invention, while one of nickel, cobalt and zinc is used as an additional metal layer for laser drilling and the additional metal layer is removed at the last stage, the metals each constituting the additional metal layer can be recycled. Description will be given of the present invention below.

A manufacturing process for a printed wiring board according to claims 1 to 4 is a manufacturing process for a printed wiring board in which a copper clad laminate obtained by bonding a copper foil on resin as a substrate material is irradiated with laser light to form a through hole or a hole such as IVH, BVH or the like therein and interlayer connection layer formation is performed, followed by performing circuit formation, including the steps of: forming an additional metal layer with a prescribed thickness on a surface of the copper foil residing in an external layer of the copper clad laminate; irradiating a surface of the additional metal layer with laser light at a prescribed position where the through hole or the hole such as IVH, BVH or the like is to be formed in the copper clad laminate to remove the additional metal layer, the copper foil, and the resin layer as a substrate material simultaneously into a desired shape; using an etching method and a physical polishing method, singly or in combination, to remove the additional metal layer as a surface layer of the copper clad laminate after the laser drilling; performing interlayer connection layer formation to obtain interlayer connection in the copper clad laminate from which the additional metal layer is removed; and forming an etching resist layer on a surface of the copper clad laminate after copper plating, followed by exposure, development, circuit etching and etching resist removal.

To use nickel as a material of the additional metal layer is the present invention relating to claim 1, to use cobalt as a material of the additional metal layer is the present invention relating to claim 2 and to use zinc as a material of the additional metal layer is the present invention relating to claim 3.

Figure 1:
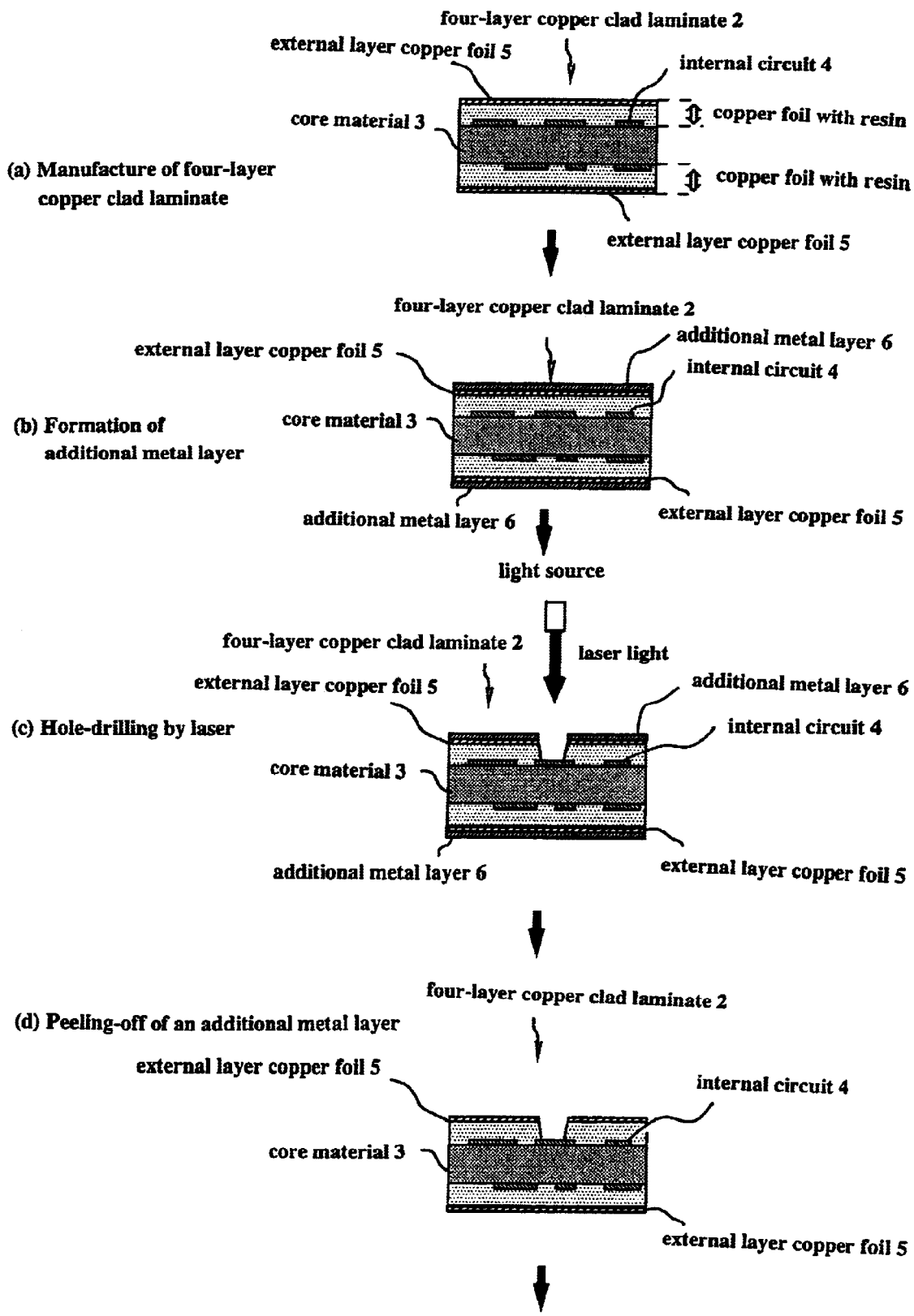
FIG. 1, FIG. 2, and FIG. 3 are a series of schematic views showing a flow of a manufacturing process for a printed wiring board.
Figure 2:
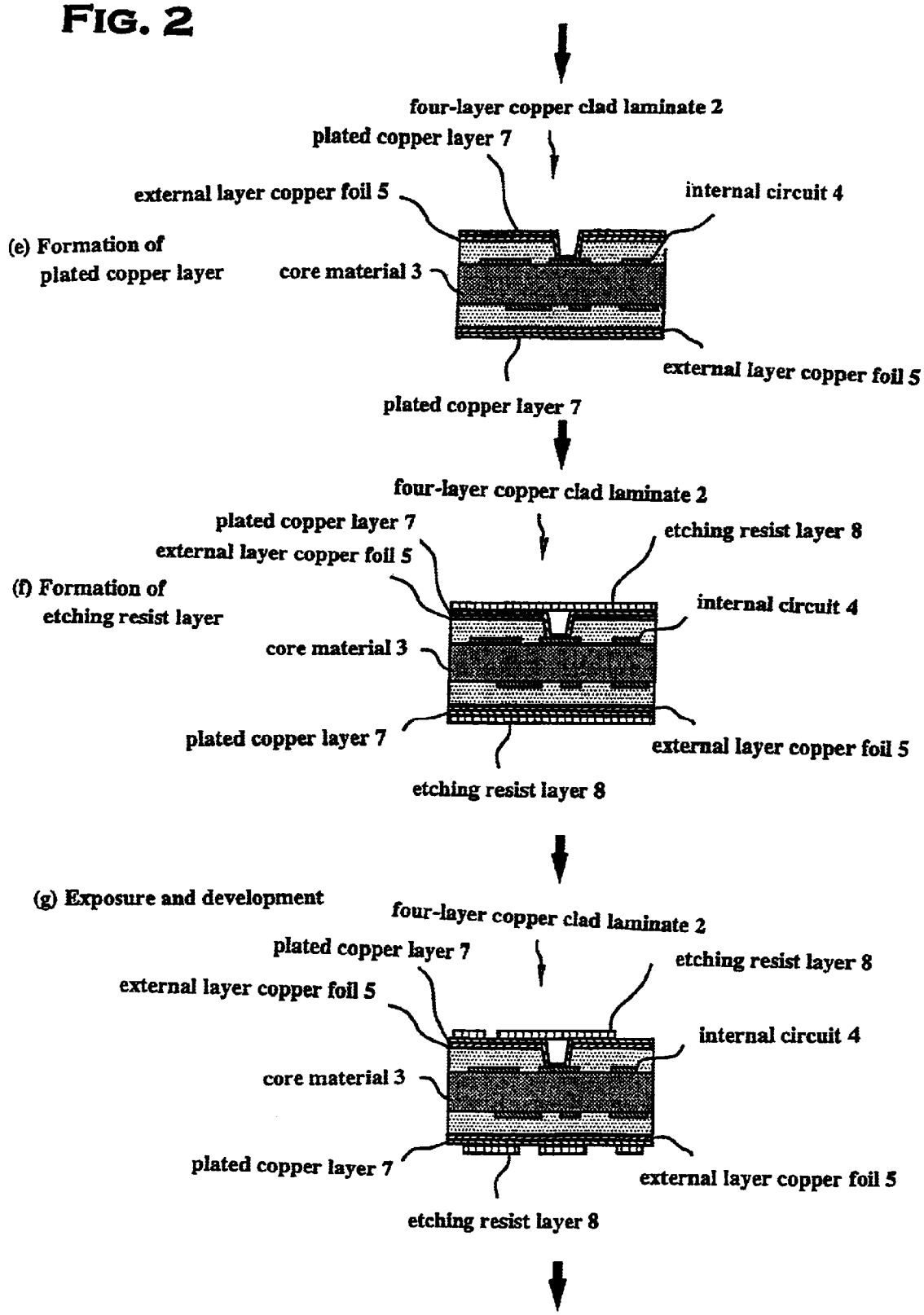
Figure 3:
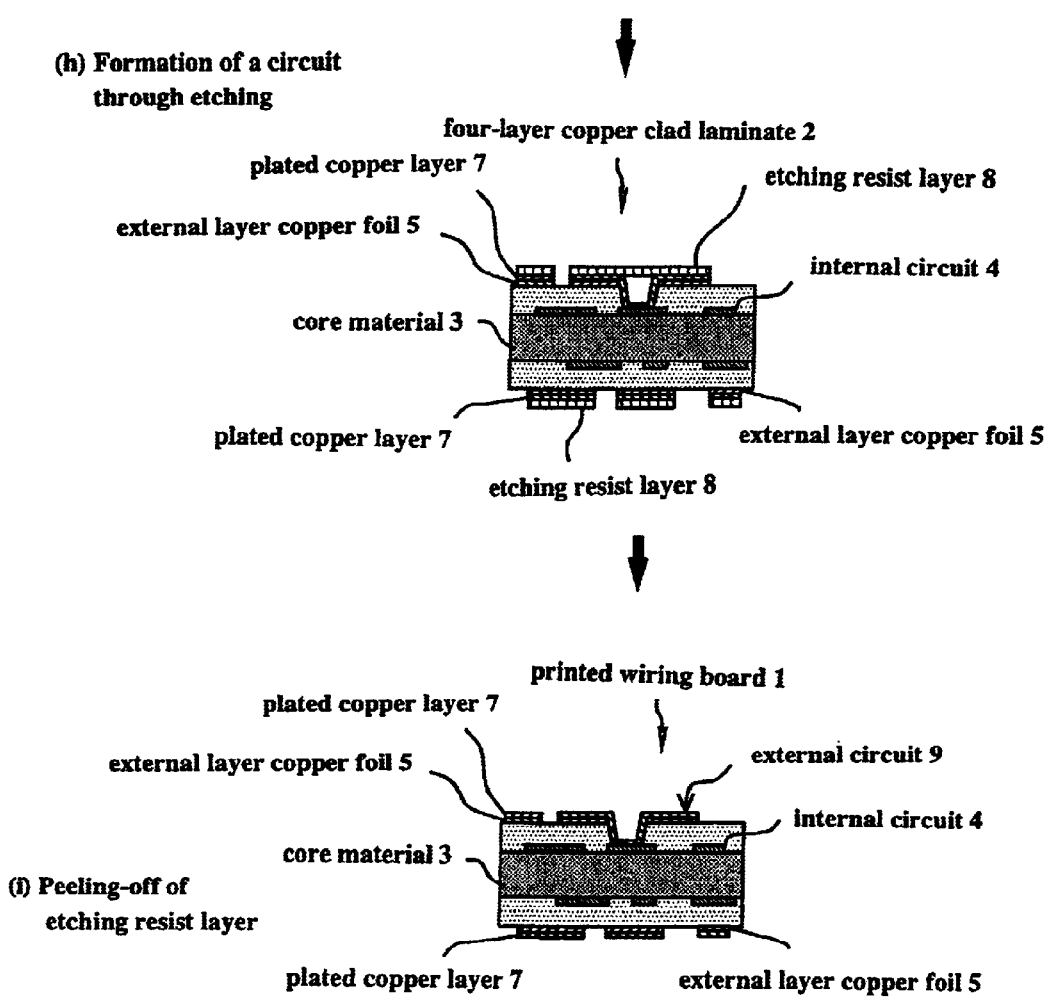

In FIGS. 1 to 3, there is shown a series of schematic views in a flow of a manufacturing process for a printed wiring board relating to claims 1 to 4. Herein, fundamental description will be given using a characteristically simplified sectional view of a four-layer copper clad laminate shown in FIG. 1(*a*). Note that the term, "copper clad laminate obtained by bonding a copper foil on resin as a substrate material" appeared above and to be appeared below is used as a concept including a double-sided board and a multilayer copper clad laminate with three layers or more except a single-sided board, and in the case of the multilayer board with three layers or more, an internal layer core material is included in counting.

First of all, nickel layers each of 0.08 to 2 $\mu$m in thickness, cobalt layers each of 0.05 to 3 $\mu$m in thickness or zinc layers each of 0.03 to 2 $\mu$m in thickness are formed as additional metal layers each with a prescribed thickness on surfaces of copper foils residing in external layers as shown in FIG. 1(*b*) at surfaces of a copper clad laminate shown in FIG. 1(*a*). For formation of the nickel layers, there are available an electroplating method performed in a wet condition, a vapor deposition method performed in a dry condition and other methods. From the view point of productivity and complexity in control, it is considered to be advantageous to use the electroplating method.

In a manufacturing process for a printed wiring board according to claim 1, in the case where a nickel layer is formed by the electroplating method, a solution used as a nickel plating solution can be widely used. For example, the nickel electroplating can be performed in the following various conditions: (1) nickel sulfate is used and other conditions are such that a nickel concentration is in the range of 5 to 30 g/l, a liquid temperature is in the range of 20 to 50° C., a pH value is in the range of 2 to 4 and a current density is in the range of 0.3 to 10 A/dm$^2$; (2) nickel sulfate is used and other conditions are such that a nickel concentration is in the range of 5 to 30 g/l, a potassium pyrophosphate (as a solute) concentration is in the range of 50 to 500 g/l, a liquid temperature is in the range of 20 to 50° C., a pH value is in the range of 8 to 11 and a current density is in the range of 0.3 to 10 A/dm$^2$; and (3) nickel sulfate is used and other conditions are such that a nickel concentration is in the range of 10 to 70 g/l, a boric acid (as a solute) concentration is in the range of 20 to 60 g/l, a liquid temperature is in the range of 20 to 50° C., a pH value is in the range of 2 to 4 and a current density is in the range of 1 to 50 A/dm$^2$, all with general other conditions for a Watt bath. Furthermore, an electroless plating method can be adopted as an electrochemical method.

Herein, a thickness of a nickel layer is set in the range of 0.08 to 2 $\mu$m. While the reason for determination of such a range will be described later in more detail, to be simply described here, the range is determined taking into consideration an actual aspect of product manufacturing as a range in which a role to improve machining performance in laser drilling in a nickel layer, which will be described below, can be sufficiently played. That is, nickel can be said a highly expensive metal among metal materials. Therefore, a product cost increases with an increase in amount of nickel in a product and it is sufficient to use nickel in a small amount in the range to achieve the object of the present invention. Even if a nickel layer of a thickness exceeding 2 $\mu$m is formed, which is the upper limit, a machinability performance in laser drilling does not increase any more than that at the upper limit, only to lose cost efficiency.

Furthermore, in the case where the thickness is less than 0.08 $\mu$m, which is the lower limit, a variation arises in machinability performance in laser drilling. For example, even in a case of a thickness of 0.03 $\mu$m as well, improvement on machinability performance in laser drilling is obtained, compared with the case where a copper clad laminate with perfectly no nickel layer is used. While much better machinability performance in laser drilling can be obtained, not only is a variation in the performance between lots larger, but a longer time is required for measurement of a plated thickness using X rays conducted during process control, which causes the process control to be complicated. Note that a surface of a nickel layer formed at this time has no limitation on a surface, causing no inconvenience regardless of a surface; the surface may be a shiny and smooth metal surface or a matte surface. This point is fundamentally different from the case of direct drilling on a copper foil with shiny surface.

Furthermore, in the case of nickel, by using a phosphate containing solution, a nickel-phosphorus alloy can be used instead of nickel. In this case, conditions for the electroplating to be adopted are that a nickel sulfate concentration is in the range of 120 to 180 g/l, a nickel chloride concentration is in the range of 35 to 55 g/l, a $H_3PO_4$ concentration is in the range of 30 to 50 g/l, a $H_3PO_3$ concentration is in the range of 20 to 40 g/l, a liquid temperature is in the range of 70 to 95° C., a pH value is in the range of 0.5 to 1.5, a current density is in the range of 5 to 50 A/dm$^2$ and so on. In the present specification, in the case where "a nickel layer" is used as an additional metal layer, it should be written as "a nickel alloy alloy" to be exact, and includes "a nickel-phosphorus alloy layer as well.

In a manufacturing process for a printed wiring board according to claim 2, in the case where a cobalt layer is formed, a solution used as a cobalt plating solution can be used. For example, the cobalt electroplating can be performed in the following various ways: (1) cobalt sulfate is used and other conditions are such that a cobalt concentration is in the range of 5 to 30 g/l, a trisodium citrate (as a solute) concentration is in the range of 50 to 500 g/l, a liquid temperature is in the range of 20 to 50° C., a pH value is in the range of 2 to 4 and a current density is in the range of 0.3 to 10 A/dm$^2$; (2) cobalt sulfate is used and other conditions are such that a cobalt concentration is in the range of 5 to 30 g/l, a potassium pyrophosphate (as a solute) concentration is in the range of 50 to 500 g/l, a liquid temperature is in the range of 20 to 50° C., a pH value is in the range of 8 to 11 and a current density is in the range of 0.3 to 10 A/dm$^2$; and (3) cobalt sulfate is used and other conditions are such that a cobalt concentration is in the range of 10 to 70 g/l, a boric acid (as a solute) concentration is in the range of 20 to 60 g/l, a liquid temperature is in the range of 20 to 50° C., a pH value is in the range of 2 to 4 and a current density is in the range of 1 to 50 A/dm$^2$, all with other conditions. The reason why a thickness of the cobalt layer has the upper and lower limits set in the range of 0.05 to 3 μm, respectively, in claim 2 is similar to the case of the nickel layer in claim 1, which will be detailed later.

Formation of the nickel layer or the cobalt layer is desirably performed with a dry method such as a simple vapor deposition method or a sputtering method, or a plating method using an electrochemical process. This is because the methods are easy in control of layer thickness. The simple vapor deposition method is such that nickel or cobalt is charged into a heat basket in a low vacuum chamber at 0.13 Pa level, and the metal is heated at high temperature, evaporated and deposited on a surface of a copper foil while the sputtering vapor deposition method is such that a target of nickel or cobalt is used, and ions of argon or the like are caused to hit the target to eject atoms of nickel or cobalt and to cause them to attach on the surface of a copper foil, thereby forming an additional metal layer. Suited manufacturing conditions have only to be selected arbitrarily for a process, giving a consideration to productivity.

In a manufacturing process for a printed wiring board according to claim 3, in the case where a zinc layer is formed, there can be adopted a method to deposit the rust-preventive element on a surface of an electrodeposited copper foil layer in electrolysis and others including a so-called substitution deposition method. For example, in the case where a zinc rust-preventive treatment is performed, a zinc pyrophosphate plating bath, a zinc cyanide plating bath, a zinc sulfate plating bath and others can be used. Among them, for example, in a case of the zinc pyrophosphate plating bath, the zinc electroplating can be performed in conditions that a zinc concentration is in the range of 5 to 30 g/l, a potassium pyrophosphate concentration is in the range of 50 to 500 g/l, a liquid temperature is in the range of 20 to 50° C., a pH value is in the range of 9 to 12, a current density is in the range of 0.3 to 10 A/dm$^2$ with other conditions. The reason why a thickness of the zinc layer has the upper and lower limits set in the range of 0.03 to 2 μm, respectively, in claim 3 is similar to the case of the nickel layer in claim 1, so duplicate description thereof is omitted.

After formation of the additional metal layer, as shown in FIG. 1(c), a portion where a through hole or a hole such as IVH or BVH is drilled is irradiated with laser light, thereby performing shaping machining for the through hole or the hole. As described above, even when a matte side of a copper foil residing in an external layer of a copper clad laminate was irradiated with laser light to remove the copper foil and resin as a substrate material simultaneously, almost no satisfactory drilling was able to be achieved. However, when an additional metal layer was provided on a matte side of the copper foil residing in the external layer of the copper clad laminate, drilling can be performed with extreme ease.

At the current stage, the reason why machining performance in laser drilling is improved with ease when a nickel layer, a cobalt layer or a zinc layer is provided on a copper foil is not made clear by an established logic. However, the inventors of the present invention assume the following logic.

The inventors of the present invention thought out the reason why drilling in a simple copper foil with laser light is difficult in the following way: No reference has been available that laser machinability of a copper foil or the like is theoretically investigated like this. Herein, if laser output energy is P, a surface reflection and a thermal conduction loss is η, energy contributing to temperature rise of a work piece is given by P(1−η). Therefore, it is established that P(1−η)=m·C·ΔT. In this expression, m is given so as to satisfy the following equation: P(1−η)=π(d/2)$^2$·H·ρ·C·ΔT, where a drilled hole diameter is d, a machining thickness is H and a specific gravity of copper is ρ. Therefore, ΔT=4P(1−η)/(π·d$^2$·H·ρ·C). Conditions for melting copper are considered using this equation. In this case, assume that a drilled hole of a diameter of 125 μm is formed in copper foils of various thicknesses under operating conditions of a pulse width of 60 μsec and pulse energy of 16.0 mJ and a laser beam diameter of 160 μm and that furthermore, parameters are set such that ρ=8.94 g/cm$^3$, C=0.39 J/K·g, resulting in ΔT=4P(1−η)/(10.95·d$^2$·H), which is adopted as a theoretical equation.

Figure 4:
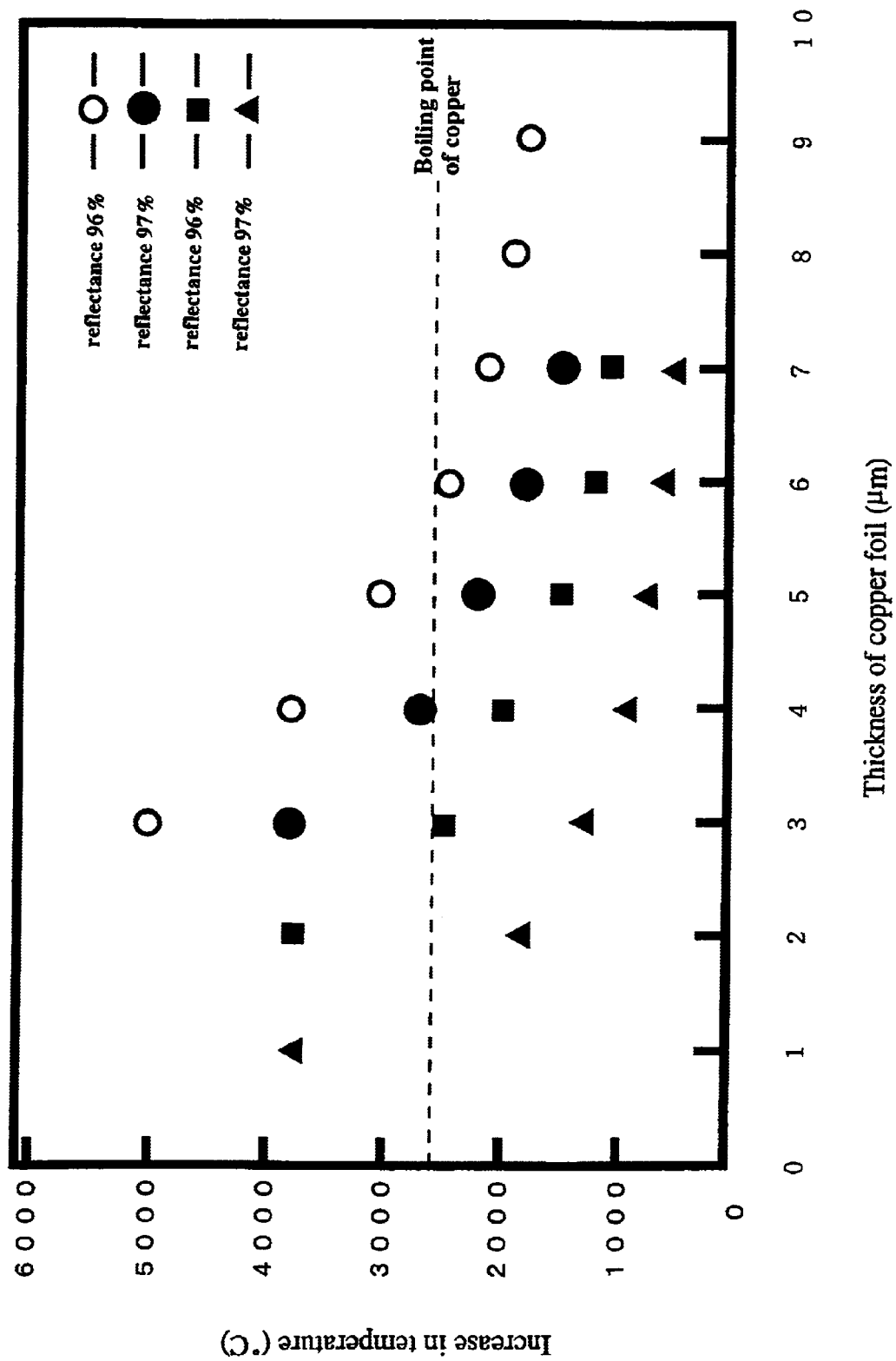
FIG. 4 shows simulation results on an increase in temperature of a copper foil under laser irradiation.

In order to enable drilling in a copper foil with laser light, the laser light is required to melt copper therewith to heat the copper to a temperature higher than the boiling point. Based on the theoretical equation, a reflectance on a surface of a copper foil was used as a value of η and rise in temperature was simulated for each thickness of copper foil and results of the simulation are shown in FIG. 4. As can be seen from FIG. 4, only with a change of 1% in reflectance, a difference of 1000° C. or higher arises in temperature rise. From the results of the simulations, in order to enable drilling in a very thin copper foil of 3 to 4 μm in thickness, it can be determined that a copper foil cannot be used in actual operation unless a reflectance is of 98% or less.

The above simulations were performed on conditions that a surface of a copper foil irradiated with laser light maintains a reflectance at an assumed value at all times from the start to end of drilling. By changing a roughness of an initial surface of a copper foil or the like, a reflectance of an initial surface thereof can be confined within an intended range of values and generally, a surface of an external layer copper foil of a copper clad laminate has an original roughness that a matte side of the copper foil has or a prescribed roughness achieved by polishing, which cannot be said a smooth mirror-finish. However, with the start of irradiation with laser light, a surface having a prescribed roughness of a copper foil begins to melt and a copper component in the initial irradiated surface is molten and evaporated, when a smooth mirror-finished copper surface of copper is formed under the initial surface thereof. A reflectance of the surface of a copper foil having come to have a mirror-finished surface in such a way is of a value of 98% or higher in a usual case. As a result, laser drilling in a copper foil to a depth or more becomes difficult.

When drilling is performed in copper with laser light, a process in which copper is continuously evaporated down to a prescribed thickness of the foil has to be reproduced. That is, while a copper foil is irradiated with laser light, at least a portion in irradiation has to be heated at temperature higher than the boiling temperature of copper.

Then, consider cases of nickel and cobalt. If a nickel layer or a cobalt layer with a prescribed thickness is provided on a surface of a copper foil, a temperature of a drilling portion raised by laser light can be maintained with ease at a value equal to or higher than the boiling point of copper. The nickel layer or the cobalt layer is considered to act as described below: Copper is an element classified as a noble metal in Group IB of the periodic table of the elements and has physical properties such as a melting point of 1083° C., a boiling point of 2582° C. and a fusion enthalpy (fusion heat) of 13.3 kJ/mol under condition of 1.01×10$^5$ Pa.

On the other hand, nickel is an element classified in Group VIII of the periodic table of the elements and has physical properties such as a melting point of 1455° C., a boiling point of 2731° C. and a fusion enthalpy (fusion heat) of 17.6 kJ/mol under condition of $1.01 \times 10^5$ Pa. Cobalt is an element classified in Group VIII of the periodic table of the elements and has physical properties such as a melting point of 1492° C., a boiling point of 2747° C. and a fusion enthalpy (fusion heat) of 14.4 kJ/mol under condition of $1.01 \times 10^5$ Pa. The physical properties of nickel and cobalt approximate to each other very much and in comparison with copper concerning boiling temperature, the boiling points of both metals are higher than copper by a value of the order of 150 to 160° C. As long as adaptability of both metals is judged from the properties, nickel and cobalt are considered to be more stable than copper against heat. Therefore, in drilling using laser light, high energy is given to a portion irradiated with the laser light to thereby rapidly raise a temperature at the portion, to melt and evaporate material of the portion and to form a hole, so a logic that nickel and cobalt are more easily drilled compared with copper is considered not to be established.

On the other hand, compare copper with nickel and cobalt in thermal conductance performance, here. A thermal conductivity of copper is 354 W·m$^{-1}$·K$^{-1}$ at 700° C. and is a good conductor. In contrast to this, nickel is 71 W·m$^{-1}$·K$^{-1}$ at 700° C. and cobalt is 69 W·m$^{-1}$·K$^{-1}$ at 700° C., and a thermal conductivity of each of both metal is on the order of about 1/5 relative to copper, from which it is found values of the thermal conductivity of both metals are much lower than that of copper. This is because when a surface of a copper foil of a copper clad laminate with neither a nickel layer nor a cobalt layer thereon is irradiated with laser light, from the start of the irradiation, part of the incident laser light is reflected by the matte side of a copper foil and the remaining nonrelfected light is supplied to a prescribed portion where a through hole or a hole such as IVH or BVH is formed as thermal energy. At this time, as the surface of a copper foil is in a more mirror-finished state, a reflectance of the laser light is higher to thereby reduce a proportion of laser light to be converted into thermal energy. It is considered that an area of portions where drilling is performed with laser light is much smaller compared with the total area of all the copper clad laminate; therefore, even if the portions are heated to a high temperature in an instant, copper, which is a good thermal conductor, immediately diffuses heat given by the laser light, which makes it to be difficult for concentrated heat to stay within each of the portions. That is, it is considered that a mirror-finished surface of a copper foil left after removal of an irradiated initial surface has a higher reflectance of the laser light and thereby a supply of thermal energy given to a copper foil layer irradiated with the laser light is reduced, in addition to which the heat given to the copper foil layer diffuses and disperses, thereby, being both considered, causing a temperature of the copper foil layer to come into equilibrium between the supply and the diffusion at a value lower than the boiling point; therefore it is difficult for a temperature of the copper foil layer to rise to a value equal to or higher than the boiling point.

In contrast to this, heat is transmitted through nickel or cobalt at a speed only about 1/5 times that of copper from comparison in thermal conductivity. Therefore, it is considered that when a surface of a nickel layer or a cobalt layer formed on a copper foil of a copper clad laminate is irradiated with laser light, thermal energy is concentrated in portions of the additional metal layer irradiated with the laser light, and a supply speed of heat is faster than a diffusion speed of heat and thereby, the portions irradiated with the laser light are heated to the melting point of nickel or cobalt with ease. In addition, when copper is compared with nickel and cobalt in a condition that all the metals have the same surface roughness, a reflectance of each of nickel and cobalt is apparently smaller than that of copper at least by the order of 1 to 2%, increasing absorbance of the laser light. This suggests a possibility that a temperature of a portion irradiated with the laser light is higher by a difference equal to or more than 1000° C. as can be seen from the temperature rise simulation on a cooper foil.

It is considered that as a result, nickel and cobalt are faster to increase temperature thereof by laser light and despite higher melting points, easier to melt and easier to evaporate. It is considered that once nickel or cobalt, which is higher in melting point, begins to be molten and to reach a boiling point by irradiation with laser light, heat having raised a temperature of nickel or cobalt to a boiling point is then transmitted to a copper foil layer constituted of a copper, which is a good conductor, the copper foil layer is easily heated to a temperature exceeding the melting point thereof with the help of continuous supply of heat energy by irradiation with the laser light and in such a way, the heat from nickel or cobalt and the heat of supply from the laser light serves as a driving force to lead the copper foil in a portion irradiated with the laser light to the boiling point thereof; thereby not only causing removal of the copper foil with the laser light to be easy but also realizing simultaneous removal of the copper foil layer of the copper clad laminate and the resin as a substrate material. An additional metal layer constituted of nickel or cobalt on a surface treated copper foil and an electrodeposited copper foil with a carrier foil, described below, plays a role similar to that described above.

Moreover, on the other hand, a definite logic has not been established of the reason why a machining performance in laser drilling is improved with ease if a zinc layer of a prescribed thickness is disposed on a copper foil either. In the course of a study, however, the inventors of the present invention has gained an impression that the machining performance in laser drilling is improved according to the following principle.

The inventors of the present invention has derived the theoretical equation $\Delta T = 4P(1-\eta)/(10.95 \cdot d^2 \cdot H)$ and as understood from the equation, only with a change of 1% in reflectance, a difference of 1000° C. or more arises in temperature rise, which can be shown in FIG. 2. As a matter of fact, temperature rise is considered to be at a level of several hundreds of degrees due to the presence of a latent heat, a fusion heat and others. It is understood therefore that in order to enable drilling in a very thin copper foil of 3 to 4 μm, a reflectance of 98% or lower is required and a copper foil with a higher reflectance cannot be used in an actual operation. This simulation is obtained, as described above, on condition that a surface of a copper foil irradiated with laser light maintains an assumed reflectance at all times during a period from the start to end of drilling and the reason why drilling in only a copper foil using carbon dioxide laser is hard to be realized is as described above.

When a zinc layer with a prescribed thickness is provided on the surface of a copper foil, a portion drilled with laser light can be easily maintained at a temperature of the boiling point or higher of copper. How the zinc layer acts is considered in the following way. The physical properties of copper are as described above.

In contrast to copper, zinc is an element classified in Group IIB of the periodic table of the elements with physical properties of a melting point of 419° C., a boiling point 906°

C., fusion enthalpy (fusion heat) of 7.5 kJ/mol in a condition of $1.01 \times 10^5$ Pa. The boiling point is lower than that of copper by the order of 1700° C. as compared with copper. As far as adaptability of zinc is judged from the physical properties, zinc would be weak against heat compared with copper; therefore zinc would be more unstable than copper is. Furthermore, since drilling with laser light is a process that high energy is supplied to a portion irradiated with the laser light to thereby raise a temperature of the portion rapidly and to melt and evaporate a material of the portion, it is generally considered that zinc is concluded to be faster in evaporation and thereby, faster in becoming extinct compared with copper.

Zinc, however, has a nature to easily bond with oxygen in the air to change to zinc oxide. If zinc is especially placed in the air at a temperature in the vicinity of 1500° C., zinc starts a combustion reaction. Zinc is very easy to be transformed into zinc oxide through the combustion reaction. That is, it is considered that by illuminating a surface of a copper foil having a zinc layer thereon as an additional metal layer with laser light, a temperature of the zinc layer is raised soon after the start of the irradiation to reach a temperature of the order of 1500° C., to thereby start the combustion reaction and to be transformed into zinc oxide.

Herein, consider the physical properties of zinc oxide, zinc oxide has a nature that it sublimes in a solid state at a fixed temperature in the atmospheric pressure without a period of a molten state to pass through. The sublimation temperature of zinc oxide is 1725° C., which is higher than the boiling point of copper by a value of the order of 700° C.

Consider thermal conductivity of zinc and copper. The thermal conductivity of copper is 0.989 cal·cm$^{-1}$·deg$^{-1}$ at 20° C., indicating being a good conductor and that of zinc is 0.268 cal·cm$^{-1}$·deg$^{-1}$ at 20° C. Therefore, zinc is of a thermal conductivity in the order of about ¼ times that of copper prior to transformation to zinc oxide. Zinc is oxidized and transformed into zinc oxide with a thermal conductivity extremely lower, even as compared with that of zinc. The inventors of the present invention considered the reason for improvement on drilling performance with laser on a copper foil in the presence of a zinc layer in the following way based on the above facts.

From the above discussion, when a surface of a copper foil of a copper clad laminate with no zinc layer thereon is irradiated with laser light, part of laser light is reflected by the mirror-finished surface of a copper foil at the start of the irradiation, while the rest of the laser light is supplied to a prescribed portion where a through hole or a hole such as IVH or BVH is formed as thermal energy. At this time, as the surface of a copper foil is in a more mirror-finished state, a reflectance of laser light is higher to thereby reduce a proportion at which incident laser light is converted to thermal energy. As compared with a total area of all the copper clad laminate, an area of portions in drilling with laser light is very small; therefore, it is considered that even if each portion is heated to a high temperature in an instant, copper, which is a good conductor, immediately diffuses heat supplied from laser light to cause the concentrated heat to be hard to stay in the limited each portion. Moreover, it is considered that after the surface irradiated with the laser light in an initial period has been removed, a molten surface thereof becomes a perfectly mirror-finished state to thereby enhance a reflectance of the laser light to a high value, to reduce a supply of heat energy given to the copper foil irradiated with the laser light and to cause part diffused and dispersed of heat given to the copper foil to balance with the supply of heat energy at a temperature lower than the boiling point of copper, thereby causing a temperature of the copper foil in the portion irradiated with the laser light to be hard to rise to temperature equal to or higher than the boiling point of copper.

In contrast to the case discussed above, zinc is transformed into zinc oxide and thereby only extremely slow thermal conduction is provided. Accordingly, it is considered that the laser light transforms a zinc layer formed on a copper foil of a copper clad laminate into an zinc oxide layer through a combustion reaction, thermal energy is concentrated to only a portion irradiated with the laser light of the zinc oxide layer, a supply speed of heat energy from the laser light is faster than a diffusion speed of heat and thereby, the portion irradiated with the laser light reaches to the sublimation temperature of zinc oxide with ease. When copper and zinc are compared with each other in a condition that both have the same surface roughness, a reflectance of zinc is apparently smaller by at least the order of 2 to 3% to increase an absorbance of zinc of the laser light. This suggests a possibility to bring a portion irradiated with the laser light to a region of a higher temperature by hundreds of degrees with ease, as compared with the case of copper as can be seen from the temperature rise simulation of the copper foil.

As a result, it is considered that temperature rise by the laser light occurs faster and sublimation occurs easier on zinc oxide, compared with that on the copper foil. It is considered that with the start of sublimation of zinc oxide in a region higher than the melting temperature of copper by a difference of 700° C. or more under irradiation with the laser light, heat bringing zinc oxide to the sublimation temperature is transmitted to the copper foil layer constituted of copper, which is a good conductor, to cause a temperature rise in copper in excess of the melting point thereof with ease with the help of continuous supply of thermal energy from irradiation with the laser light, which serves as a driving force to bring a copper foil temperature in a portion irradiated with the laser light to the boiling temperature of copper, thereby enabling not only removal of the copper foil layer to be performed by the laser light with ease, but also simultaneous removal of the copper foil layer of the copper clad laminate and the resin as a substrate material to be performed. That is, although zinc is a metal of a melting point lower than copper, an additional metal layer constituted of zinc is considered to play a role similar to those of nickel and cobalt, which are described above.

In the case where a nickel layer is used as an additional metal layer, a thickness preferably ranges from 0.08 to 2 μm; in the case where a cobalt layer is used as an additional metal layer, a thickness preferably ranges from 0.05 to 3 μm; and in the case where a zinc layer is used as an additional metal layer, a thickness preferably ranges from 0.03 to 2 μm. The ranges are determined as ranges in which drilling can be performed with ease using a pulse energy at a power of 12 to 30 mJ, which is generally used in the case of carbon dioxide gas laser. An opening ratio by carbon dioxide gas laser in a copper clad laminate on which an additional metal layer in the ranges in thickness is formed is 100% in all tries and a copper foil and a substrate material component can be drilled simultaneously with certainty. Therefore, the inventors of the present invention paid attention to a relationship between a thickness of an additional metal layer on and a diameter of a drilled hole in a surface treated copper foil, both as measured actually.

Figure 5:
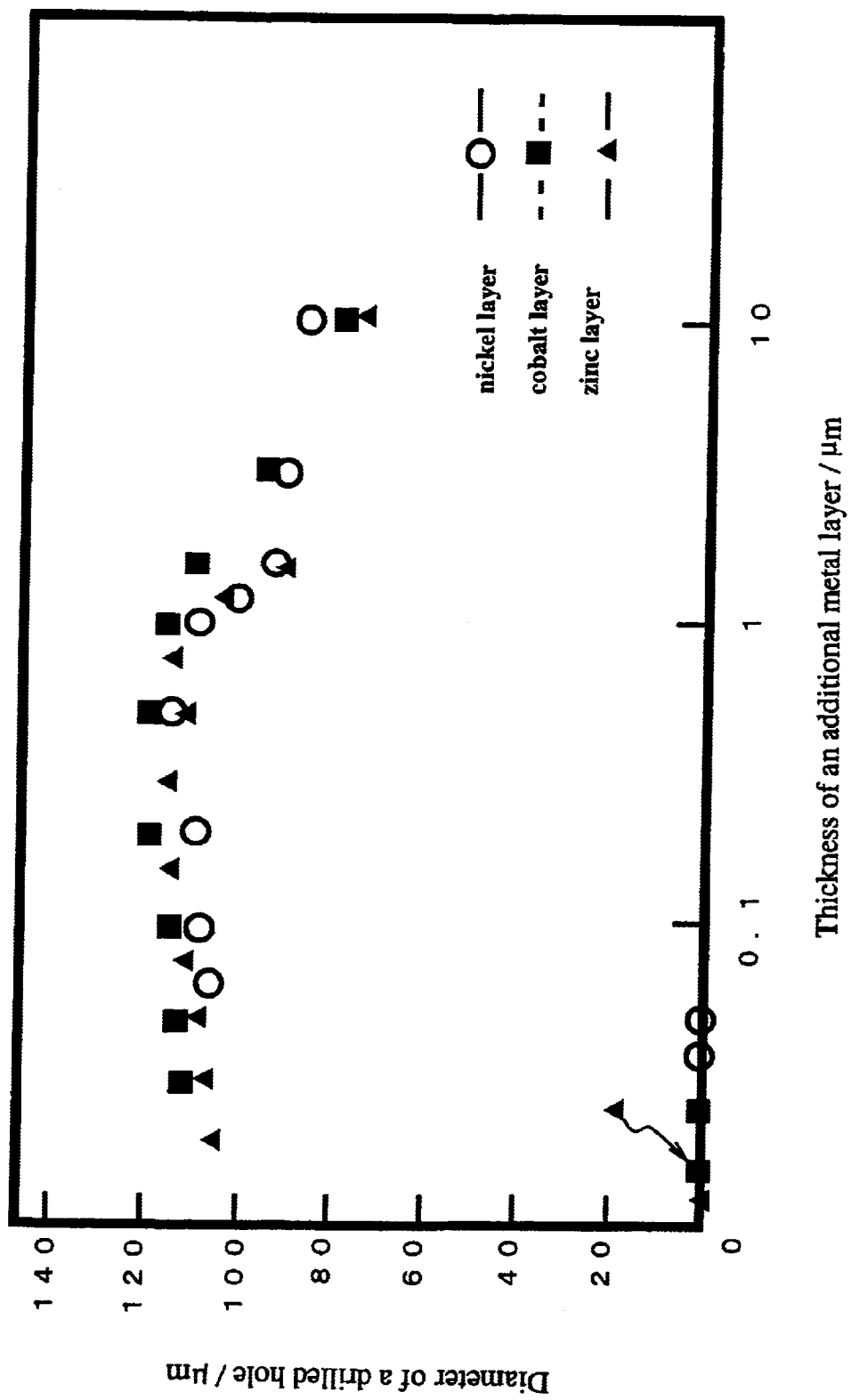
FIG. 5 shows a relationship between a thickness of an additional metal layer and a diameter of a drilled hole.

In FIG. 5, there is shown a relationship between a thickness of an additional metal layer and a diameter of a drilled hole, both as measured actually, in each of cases where nickel, cobalt and zinc are employed. Conditions for irradiation with carbon dioxide gas laser are a frequency of 2000 Hz, a mask diameter of 5.0 mm, a pulse width of 60 μsec, pulse energy of 16.0 mJ, an offset of 0.8 and a laser light beam diameter is 140 μm, under which the experiments were performed scheduling that a hole diameter of 110 μm was formed in each of copper clad laminates with copper foils of various thicknesses thereon. The reason why the pulse energy is adopted at 16.0 mJ is that a difference in machinability in drilling is more conspicuously revealed with ease with lower energy. Thus, the inventors of the present invention judged drilling as a success when a drilled diameter after the machining falls within the range of 100 to 110 μm as a specification.

From FIG. 5, it can be said to be preferable that in the case where an additional metal layer is of nickel, a thickness is 0.08 μm; in the case where an additional metal layer is of cobalt, a thickness is 0.05 μm; and in the case where an additional metal layer is of zinc, a thickness is 0.03 to 2 μm. The lower limits are each understood to be a critical value at which a drilled diameter by the machining is improved rapidly. As a thickness of an additional metal layer increases, a drilled diameter becomes better temporarily and thereafter as the thickness further increases, the drilled diameter becomes smaller to the contrary. This is considered because with increase in distance through which the laser light penetrates the auxiliary layer and further travels over to the copper foil layer, a hole formed in the additional metal layer is deeper to thereby cause focussing of the laser light and to substantially reduce a diameter of the laser light beam striking the copper foil to a smaller value.

Furthermore, it is also considered that since with an excessively large thickness of an additional metal layer, a once molten surface of each of nickel, cobalt and zinc constituting the additional metal layer becomes smooth and increases a reflectance of laser light, a temperature rise equal to that of the additional metal layer at its initial stage to which irradiation with the laser light gets started cannot be expected and as a result, a machining speed is slowed down to deteriorate a drilled diameter. Therefore, as a layer thickness at which it is judged from FIG. 5 a drilled diameter in machining of 100 μm as a target cannot be achieved, the upper limits are determined such that in a case of nickel, a thickness is 2 μm; in a case of cobalt, a thickness is 3 μm; and in a case of zinc, a thickness is 2 μm. Furthermore, as results of an increasing number N to repeat tests, in order to cause a drilled diameter after the machining to be near a target diameter, the following ranges can be said to be more preferable that in a case of nickel, a thickness ranges 0.2 to 0.8 μm; in a case of cobalt, a thickness ranges 0.1 to 0.9 μm; and in a case of zinc, a thickness ranges 0.08 to 0.8 μm. Values of the ranges were determined based on data that was obtained with the most stable drilling precision in the ranges.

As can be seen from FIG. 3, in a case of zinc, a thickness of 0.03 μm is a critical value, at which a drilled diameter after the machining becomes better rapidly. With increase in thickness of a zinc additional metal layer, a drilled diameter after the machining becomes smaller to the contrary. This is considered because with increase in a distance through which the laser light penetrates the additional metal layer and further travels over to the copper foil, a hole formed in the additional metal layer is deeper to thereby cause focussing of the laser light and to substantially reduce a diameter of the laser light beam striking the copper foil to a smaller value.

As described above, when removal of the copper foil layer by the laser light is completed according to actions of the nickel layer, the cobalt layer and the zinc layer, removal of the resin as a substrate material can be removed with ease by irradiation with the laser light in continuation. In such a manner, by forming an additional metal layer on a surface of a copper clad laminate, the additional metal layer, a copper foil layer and the resin as a substrate material can be simultaneously removed. In FIG. 1ĉ, there is shown a schematic sectional view of a state of a printed wiring board in process after laser drilling.

When the laser drilling is finished, then the additional metal layer is to be removed. In the removal of the additional metal layer, an etching method and physical polishing methods such as a buff polishing and brush polishing can be applied to a copper clad laminate because of a form and condition thereof. Moreover, application of an arbitrary combination thereof and a single use thereof are enabled adaptively to individual process steps. As an ideal case among them, for example, it is preferable that in the case where a nickel layer is formed as an additional metal layer, a selective etching solution with no capability of dissolving copper is used to selectively remove the nickel layer as a surface layer of a copper clad laminate after the laser drilling. A state of the board in process from which the auxiliary layer has been removed is schematically shown in FIG. 1(d). If the additional metal layer is left behind, the additional metal layer is situated between copper layers after copper plating of an interlayer connection layer performed later. If the board is left in the air in such a state, it is considered that a local cell is formed between copper and the additional metal layer, which layers are different from each other in ionization tendency, causing the local cell to function so as to accelerate corrosion on the side of a copper circuit to a possibility of peeling-off of a plated layer. However, actually, in cases of nickel and cobalt, copper plating can be performed without causing the peeling-off of an additional metal layer according to a kind of a printed wiring board and thereafter the printed wiring board can also be patterned.

Herein, especially in a case of a nickel layer, a selective etching solution can be used. This solution is a selective etching solution dissolving only nickel without dissolving copper and since copper is not dissolved, the copper foil layer receives any damage and has no change in thickness; therefore, control in a later circuit etching step becomes easy. As a selective etching solution, as set forth in claim 4, one of the following solutions can be used: (1) a sulfuric acid solution containing sulfuric acid of 550 ml/l to 650 ml/l in a concentration; (2) a mixed acid solution of sulfuric acid and nitric acid; and (3) a mixed solution of sulfuric acid, m-nitrobenzenesulfonic acid. The first solution is more preferably used as a sulfuric acid solution of 580 ml/l to 620 ml/l in concentration and the solution is used such that the copper clad laminate is polarized cathodically to peel off a nickel layer in electrolysis in the solution. The reason why the sulfuric concentration is here set in the range 550 ml/l to 650 ml/l is that a peeling-off speed of the nickel layer is too slow in a concentration lower than 550 ml/l, which is not suited with a practical use. Furthermore, it is because with in excess of a concentration of 650 ml/l, a peeling-off speed does not increase but rather, dissolution reactivity of nickel is slowed. The range of 580 ml/l to 620 ml/l in concentration which is more desirably set is a region most excellent in peeling-off speed and stability of solution quality.

Then, interlayer connection layer formation for obtaining interlayer connection in the copper clad laminate from which the additional metal layer is removed is performed: In FIG. 1(e), there is shown a schematic sectional view of the copper clad laminate after copper plating. The interlayer connection layer formation step at this time is not necessary to be considered to have any limitation on a method, but if means is to ensure circuit conduction between layers, any filling method may be adopted in which a through hole or a hole obtained by laser drilling is filled with metal paste such as copper paste and silver paste, and conductive resin. However, in general, copper plating including a copper electroless plating step and a copper electroplating is adopted. Even the copper electroless plating and the copper electroplating have no specific limitation thereon, but any method widely adopted has only to be used.

Steps described below may adopt conditions therefor widely known in general, therefore, detailed description thereof is omitted, but examples will be provided instead. As shown in FIG. 2(f), etching resist layers are formed on surfaces of the copper clad laminate after copper plating; as shown in FIG. 2(g), exposure and developing are applied; as shown in FIG. 3(h), circuit etching is performed; and by removal of the etching resist, a printed wiring board as shown in FIG. 3(I) can be obtained.

Then, a manufacturing process for a printed wiring board according to claims 5 and 6 is a manufacturing process for a printed wiring board in which a copper clad laminate obtained by bonding a copper foil on resin as a substrate material is irradiated with laser light to form a through hole or a hole such as IVH, BVH or the like therein and interlayer connection layer formation is performed, followed by performing circuit formation, including steps of: forming an organic layer on a surface of the copper foil residing in an external layer of the copper clad laminate; forming an additional metal layer with a prescribed thickness on a surface of the organic layer; causing a surface of the additional metal layer to be irradiated with the laser light at a prescribed position where the through hole or the hole such as IVH, BVH or the like is formed in the copper clad laminate to thereby remove the additional metal layer, the organic layer, the copper foil and the resin layer as a substrate material simultaneously into a desired shape; removing the additional metal layer from a surface of the copper clad laminate by peeling; performing interlayer connection layer formation for obtaining interlayer connection in the copper clad laminate; and forming an etching resist layer on the surface of the copper clad laminate after copper plating, followed by exposure and developing to perform circuit etching and performing etching resist removal.

Figure 6:
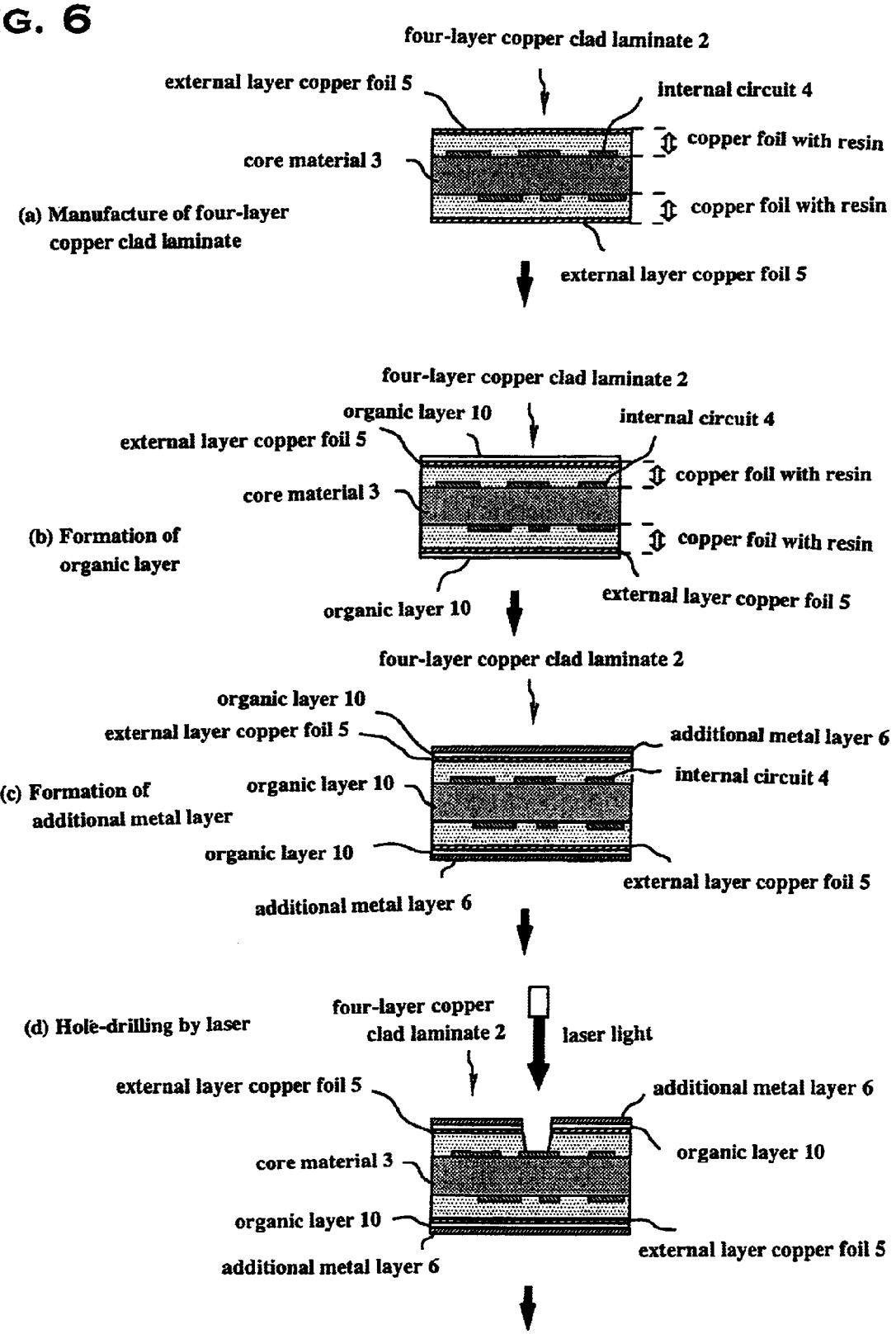
FIGS. 6 to 11 show a series of schematic views in a flow of a manufacturing process for a printed wiring board.
Figure 7:
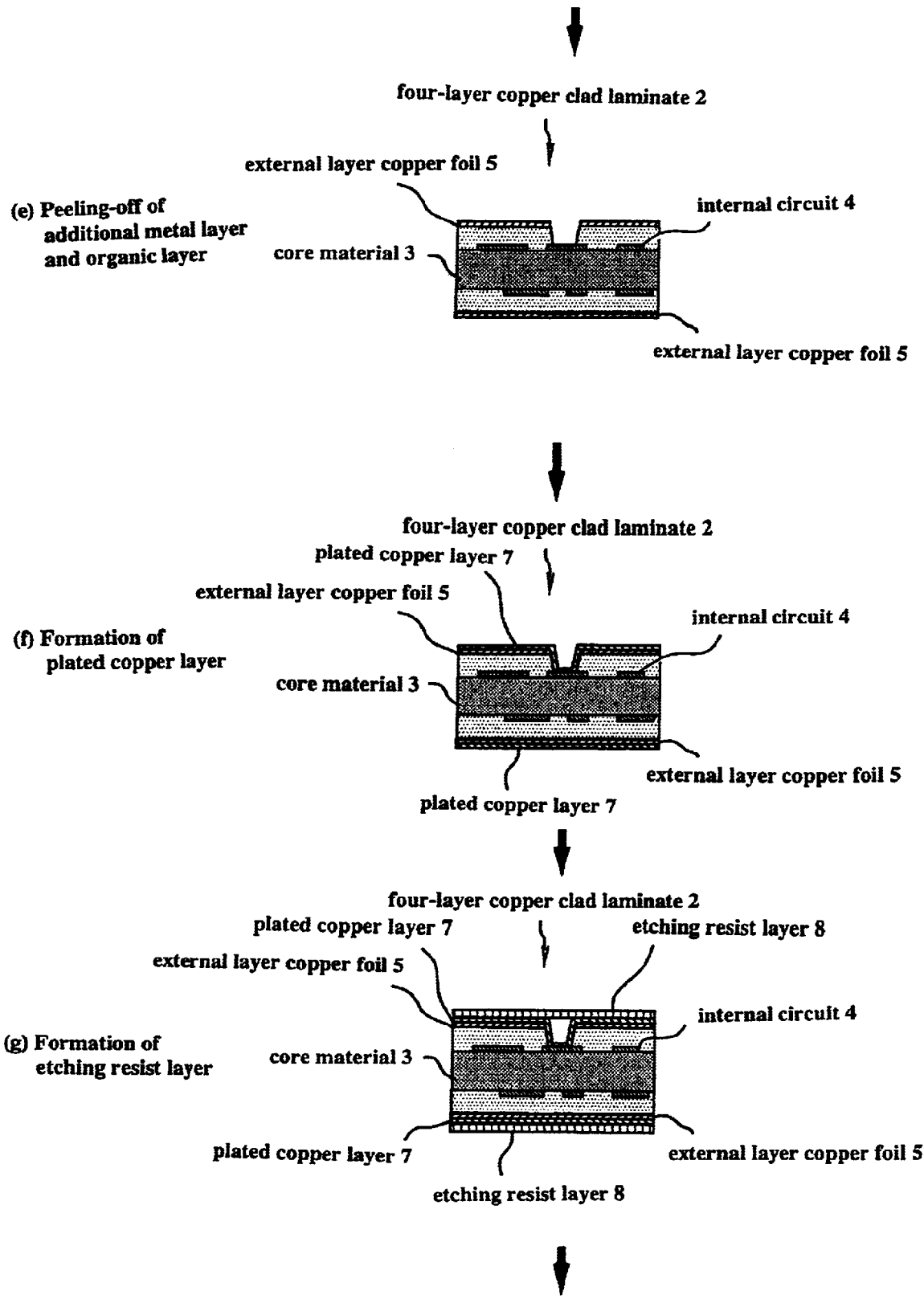
Figure 8:
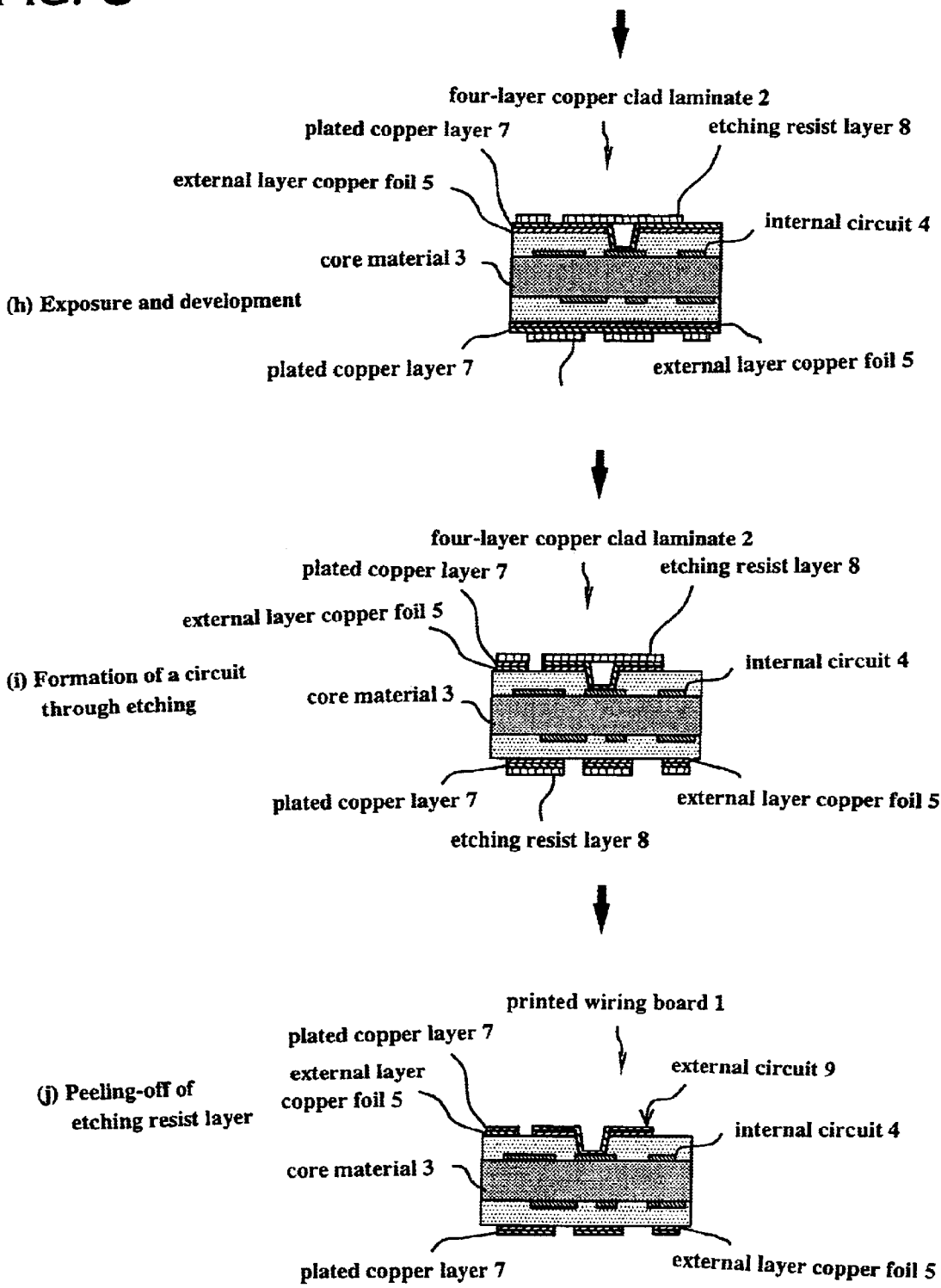

A manufacturing process for a printed wiring board according to claims 5 and 6 is shown as a series of schematic views in a flow of a manufacturing process shown in FIGS. 6 to 8. A difference from a manufacturing process according to claims 1 to 4 is in that an organic layer is formed on a surface of a copper clad laminate prior to formation of an additional metal layer. That is, by forming the organic layer and forming the additional metal layer thereon, the additional metal layer can be peeled off in manual operation by an operator with ease after laser drilling.

The case where a zinc layer is used as an additional metal layer is not an object here. This is because according to a study conducted by the inventors of the present invention, the zinc layer cannot be peeled off with ease in the case where the zinc layer is applied to a manufacturing process relating to the present invention having the organic layer since zinc is included in the range of −1000 mV to −900 mV, only the upper limit being included, in deposition potential as measured using a silver chloride-silver saturated electrode at 40° C. as a reference electrode. In contrast to this, if the deposition potential was included in the range of −900 mV, included, or higher as with nickel and cobalt, the additional metal layer could be peeled off from the copper foil layer with ease.

An organic material in use, as described in a claim, is preferably constituted of one or two selected from the group consisting of nitrogen-containing organic compounds, sulfur-containing organic compounds and carboxylic acids.

Of the nitrogen-containing organic compounds, sulfur-containing organic compounds and carboxylic acids, the nitrogen-containing organic compounds include a nitrogen-containing organic compound having a substituent. To be concrete, as the nitrogen-containing organic compounds, the following compounds are preferably used: triazole compounds having substituents such as 1,2,3-benzotriazole (hereafter referred to as "BTA"), carboxybenzotriazole (hereinafter referred to as "CBTA"), N'N'-bis (benzotriazolylmethyl)urea (hereinafter referred to as "BTD-U"), 1H-1,2,4-triazole (hereinafter referred to as "TA"), 3-amino-1H-1,2,4-triazole (hereinafter referred to as "ATA") and so on.

The sulfur-containing organic compounds in use preferably include the following compounds: mercaptobenzothiazole (hereinafter referred to as "MBT"), thiocyanuric acid (hereinafter referred to as "TCA"), 2-benzimidazolethiol (hereinafter referred to as "BIT") and so on.

As the carboxylic acids, especially monocarboxylic acids is preferably used and among them, oleic acid, linoleic acid, linolenic acid and so on are preferably used.

Description will be given of how to use the above organic agents together with a process for forming an organic layer on a surface of a copper foil of a copper clad laminate. Formation of an organic layer on the surface of a copper foil of a copper clad laminate is performed such that an organic agent described above is dissolved into a solution and the copper clad laminate is immersed into the solution, or showering, a spray method, a dropping method, an electroplating method and soon are applied on the copper clad laminate, and no necessity arises for a specifically restricted procedure. At this time, a concentration of each of all the organic agents described above in the solution at this time is preferably in the range of 0.01 g/l to 10 g/l and a liquid temperature is preferably in the range of 20 to 60° C. There is no specific limitation on a concentration of an organic agent but no problem arises essentially according to whether a concentration is higher or lower.

Moreover, formation of an organic layer can also be performed with proper combination of the above organic agents set forth in a claim, an organic layer may also be formed, as set forth in the claim, by repeatedly applying an organic agent constituted of one or constituted as a mixture of two or more selected from the group consisting of nitrogen-containing organic compounds, sulfur-containing organic compounds and carboxylic acids several times, or, as set forth in a claim, by alternately applying two organic agents or more selected from the group consisting of nitrogen-containing organic compounds, sulfur-containing organic compounds and carboxylic acids several times, wherein thus formed organic layer can be used in efficiently manufacturing a printed wiring board by a manufacturing process relating to the present invention. According to the methods, thickness control of an organic layer can be performed with higher precision.

Judging from a principle of formation of an organic layer, the above organic agents is each considered to be stably present on a surface of a copper foil of a copper clad laminate. For example, in the case where an organic layer is formed on the copper foil made of a metal, the organic agent is adsorbed on a metal oxide layer, which is a metal oxide film, formed on the surface layer of the copper foil. It is estimated that the organic agent forms a bond with a bonding partner such as oxygen present in the surface layer thereof in a state where the organic agent is adsorbed to the metal oxide layer and thereby, stabilized in the form of an organic layer. Therefore, although with increase in concentration of an organic agent, a speed at which the organic agent adsorbs to the surface of a copper foil is faster, the concentration of an organic agent is fundamentally determined according to a speed of a manufacture line. A time during which the copper foil and an organic agent dissolved in a solution are put into contact with each other is also determined by the speed of the manufacture line and the contact time ranges from 5 to 60 sec in a practical aspect.

As a conclusion obtained after all the above things are considered, if a concentration of an organic agent is lower than 0.01 g/l, adsorption thereof onto a surface of a copper foil in a short time becomes hard and in addition, a variation in thickness of an organic layer formed arises, thereby disabling stabilization of product quality. On the other hand, even with a concentration in excess of 10 g/l, especially an adsorption speed of an organic agent onto the surface of a copper foil does not increase with increase in added amount thereof, which cannot be said to be preferable in terms of production cost. By using the above organic agents, quantitative control in forming of an organic layer can be facilitated.

If an additional metal layer is formed on an organic layer thus formed, the additional metal layer can be peeled off with ease. A strength of peeling-off of an additional metal layer at this time ranges from 1 to 300 gf/cm, which enables a manual operation to remove the layer with ease. Therefore, in the present invention, a thickness of an additional metal layer is defined according to a kind of a metal of the layer. While it is the same desire as a case of a manufacturing process according to claims 1 to 4 has, to reduce a thickness of an additional metal layer to the thinnest one possible and a metal amount to be used to the smallest one possible taking manufacturing cost into consideration, smooth peeling in manual operation by an operator is likely able to be achieved if a thickness thereof is 1 $\mu$m or more in order to satisfactorily avoid breakage of the additional metal layer or other troubles in peeling removal thereof in manual operation by an operator; thus, the upper limit is determined in consideration of such circumstances together with the issue associated with a drilled diameter. The lower limit, on the other hand, has only to adopt the smallest thickness for suitable laser drilling as described above. In cases of additional metal layers less than 1 $\mu$m in thickness, there is also the case where a procedure to peel and remove a layer by sticking a tape thereon has to be adopted. If peeling-off is performed using a tape, however, removal of the auxiliary layer is enabled with certainty. Moreover, since a nickel layer and a cobalt layer in this case are peeled off in a state of a foil, thus peeled layers can be recovered and reused as a nickel foil and a cobalt foil.

As shown in FIG. 7 (e), when an additional metal layer is peeled off, most of the organic agent is removed simultaneously with peeling-off of the additional metal layer. While part of the organic agent is left behind on a surface layer of a copper foil as an organic layer, the residual organic agent is not at a level at which an adverse influence is wielded on a copper plating step and other steps coming later. However, in order to surely remove the organic agent, easy removal thereof can be ensured by acid cleaning with a solution such as a dilute sulfuric acid solution or a dilute hydrochloric acid solution.

The above organic agents are essentially not of conductive materials but of materials having an insulating property. Therefore, requirement arises for a state where a current can flow through the organic layer in a manufacturing process for a printed wiring board relating to claims 5 and 6 wherein a foil itself of a copper clad laminate is polarized as an cathode to electrolytically deposit nickel directly on the copper foil on which the organic layer is formed. That is, a thickness of the organic layer constituted of an organic agent naturally has a limitation thereon; a necessity arise for enabling a proper peeling strength to be secured and furthermore, for adjusting a thickness so as to enable stable electrodeposition of the additional metal layer.

Accordingly, it is not important what concentration an organic agent is used in a solution at or what length of a treatment time an organic layer is formed in, but a thickness of the organic layer formed as a result of the process, in other words an amount of the organic agent constituting the organic layer is important. According to a study by the inventors of the present invention, it has been found that a thickness of the organic layer is preferably in the range of 1 nm to 1 $\mu$m.

With the range in thickness clearly shown here, a peeling strength of an additional metal layer can be properly secured and in addition, stable electrodeposition of the additional metal layer is enabled. That is, if a thickness of the organic layer is less than 1 nm of the lower limit, the thickness thereof is varied, thus disabling the uniform organic layer to be formed. As a result, there arises the case where the additional metal layer cannot be peeled off.

If the thickness exceeds 1 $\mu$m of the upper limit, a current flowing state becomes unstable and deposition of the additional metal layer becomes unstable, thereby causing formation of the additional metal layer with a uniform thickness to be difficult. Moreover, even if the additional metal layer is deposited for a long time, the minimum necessary peeling strength of the order which can be safely used for an etching step cannot be satisfied. If a thickness of the organic layer further increases, a state of perfectly no current flowing is entailed. Since the thickness of the organic layer at this time is a very thin one as small as a value in the order of nm to $\mu$m level, the measurement on the thickness was performed with a transmission electron microscope (TEM).

When formation of the organic layer is completed as shown in FIG. 6(b) in such a way as described above, a manufacturing process for a printed wiring board from formation of the additional metal layer and subsequent thereto which are covered by FIGS. 6(c) to 8(j) is similar to a manufacturing process for a printed wiring board according to claims 1 to 4; therefore, duplicate description thereof is omitted.

Figure 9:
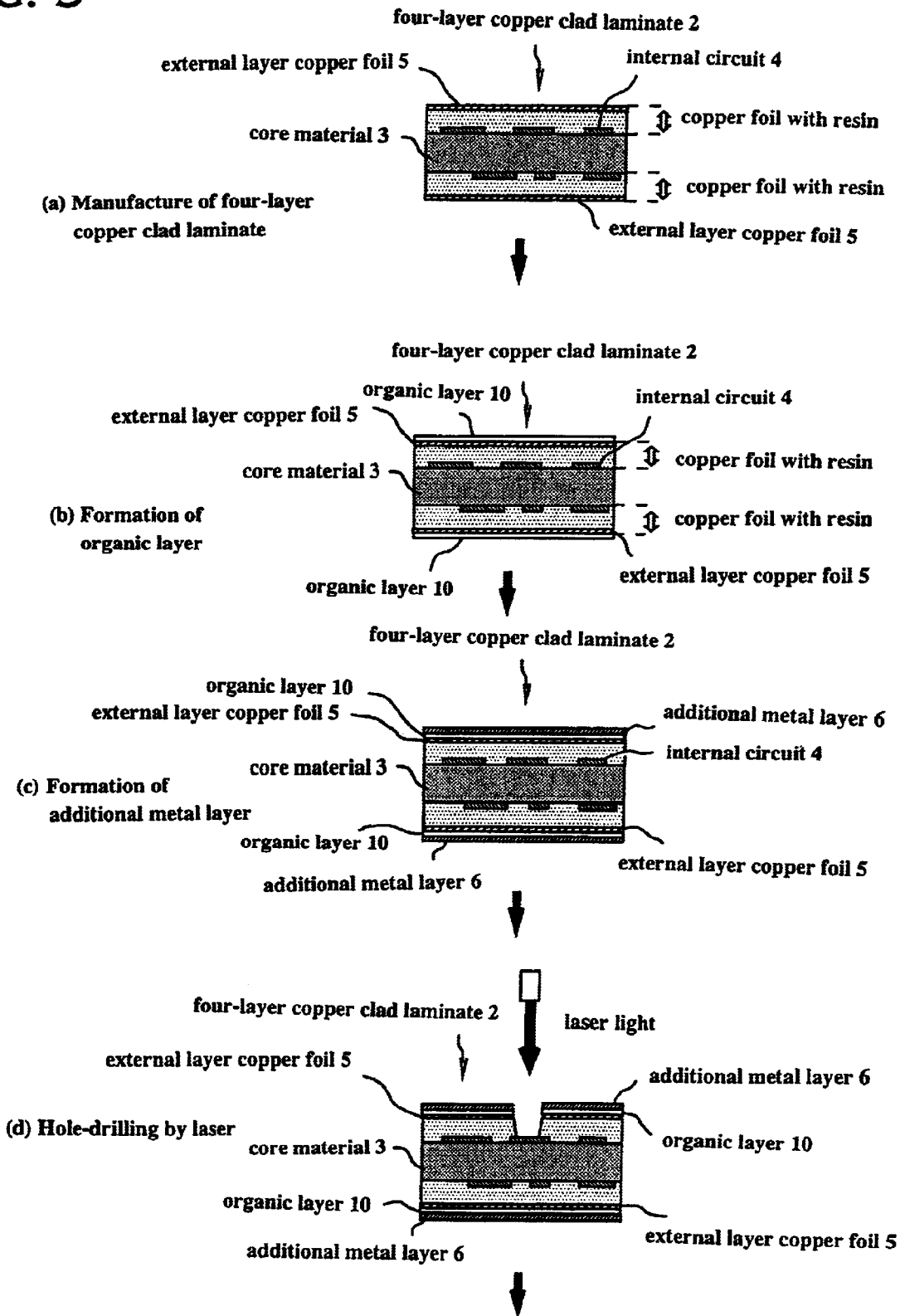
Figure 10:
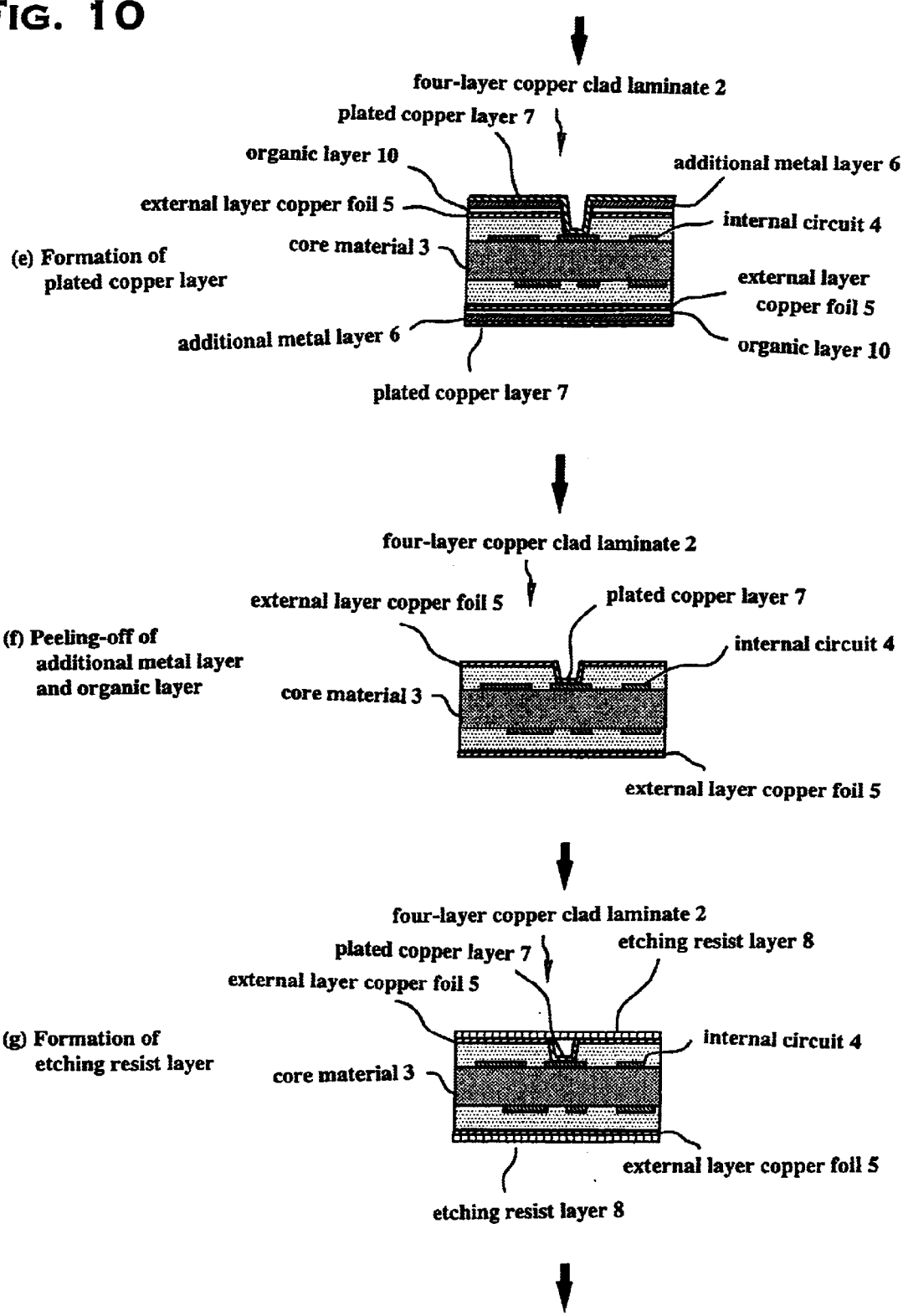
Figure 11:
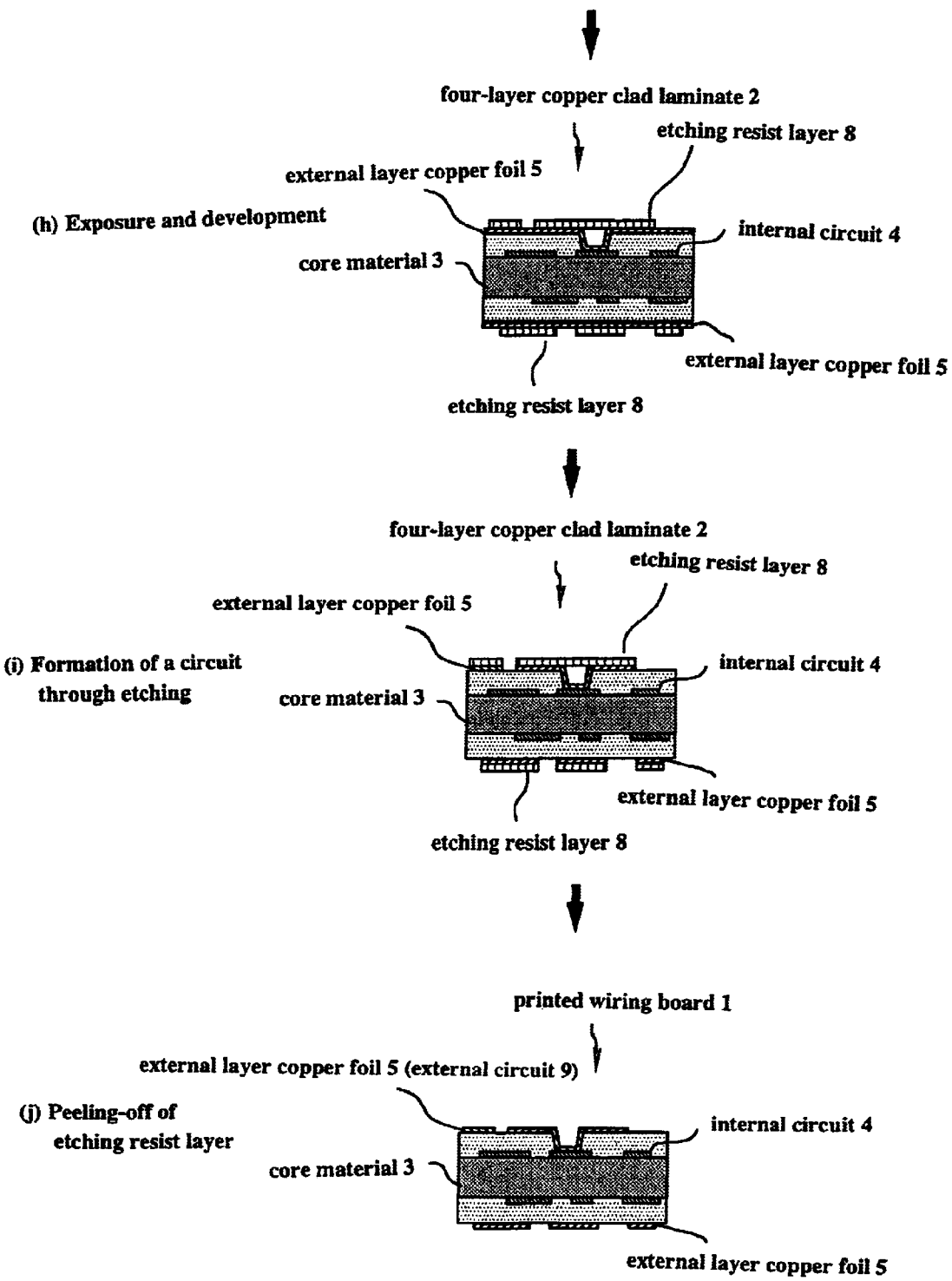

Furthermore, a manufacturing process for a printed wiring board according to claims 7 and 8 is a manufacturing process for a printed wiring board in which a copper clad laminate obtained by bonding a copper foil on resin as a substrate material is irradiated with laser light to form a through hole or a hole such as IVH, BVH or the like therein and interlayer connection layer formation is performed, followed by performing circuit formation, including steps of: forming an organic layer on a surface of a copper foil residing in an external layer of the copper clad laminate; forming an additional metal layer with a prescribed thickness on a surface of the organic layer; causing a surface of the additional metal layer to be irradiated with the laser light at a prescribed position where the through hole or the hole such as IVH, BVH or the like is formed in the copper clad laminate to thereby remove the additional metal layer, the organic layer, the copper foil and the resin layer as a substrate material simultaneously into a desired shape; performing interlayer connection layer formation for obtaining interlayer connection in the copper clad laminate; removing the additional metal layer from a surface of the copper clad laminate by peeling; and forming an etching resist layer on the surface of the copper clad laminate after removal of the additional metal layer, followed by exposure and developing to perform circuit etching; and performing etching resist removal. The series of steps of a manufacture flow are shown in FIGS. 9 to 11. Description will be given of the manufacture flow with reference to the Figures.

A manufacturing process for a printed wiring board according to claims 5 and 6 is to peel off the additional metal layer immediately after laser drilling, which is different from a manufacturing process for printed wiring board according to claims 7 and 8 in that the latter process is to perform interlayer connection layer formation for obtaining interlayer connection in the copper clad laminate after laser drilling and to thereafter peel off the additional metal layer as seen from the flow shown in FIGS. 9(d) to 10(f).

The reason why such a manufacturing process is adopted is as follows: A case is considered where after laser drilling, interlayer connection layer formation for obtaining interlayer connection in the copper clad laminate is performed using copper electroless plating and copper electroplating. In that case, a copper layer formed by the copper electroless plating and the copper electroplating is also formed on the additional metal layer as a plated copper layer as shown in FIG. 10(e). If the additional metal layer is peeled off in this state, the plated copper layer, as shown in FIG. 10(f), remains only on the inner wall surface of a depression such as BVH or the like formed by laser drilling while the plated copper layer on the additional metal layer is also removed simultaneously with removal of the additional metal layer. In such a way, by restricting a thickness of the copper foil, which is to be etched in the course of formation of a printed circuit in the external layer, to the thinnest one possible, a fine pitch circuit is formed with ease.

With respect to the other details of formation of the organic layer and formation of the additional metal layer, and an etching process subsequent thereto, there is no difference from a manufacturing process for a printed wiring board according to claims 5 and 6; therefore, duplicate description thereof is omitted. Description will be given of embodiments below.

DESCRIPTION OF THE PREFERRED EMBODIMENTS

Description will be given of embodiments of a manufacturing process for a printed wiring board relating to the present invention below. Conditions for laser drilling adopted in all examples described below were as follows: carbon laser was used, whose operating parameters are such that a frequency is 2000 Hz, a diameter of a mask is 5.0 mm, a pulse width is 60 $\mu$sec, pulse energy is 16.0 mJ, an offset is 0.8 and a diameter of a laser beam is 140 $\mu$m, and the examples were those conducted with intention to form a hole with a drilled diameter of 110 $\mu$m on each of copper clad laminates with copper foils of various thicknesses. Note that in the examples, common symbols are employed in description as often as possible.

FIRST EXAMPLE

In this example, description will be given of a manufacturing process for a printed wiring board 1 according to claim 1 using FIGS. 1 to 3. In the example, laser drilling was performed on a four-layer copper clad laminate 2 to manufacture the printed wiring board 1. As an internal layer core material 3 of the four-layer copper clad laminate 2, a double-sided substrate after inner layer circuits 4 were formed was used, copper foils with resin A were disposed on both surfaces of the inner layer core material 3, followed by hot press, and to thereby achieve a state where only a resin layer R existed without the presence of glass cloth in each of spaces between the internal layer core material and external layer copper foils 5.

First of all, nickel layers were formed as additional metal layers 6 on surfaces of the external layer copper foils 5 of the four-layer copper clad laminate 2. In formation of the additional metal layers 6, an electroplating method was employed in the following way: a nickel plating solution containing nickel sulfate was used in conditions of a nickel concentration of 20 g/l, a liquid temperature of 35° C., a pH value of 3 and a current density of 8 A/dm$^2$ to form the nickel layer of about 1 $\mu$m in thickness.

After formation of the additional metal layers 6, the laminate 2 was washed with water and surfaces of the additional metal layers 6 were dried, followed by laser drilling. Conditions for the laser drilling were as described in the opening paragraphs of this section. A drilled diameter of a formed BVH was of an opening ratio of 100% and a diameter distribution ranged from 103 to 108 $\mu$m, thus finishing the drilling at a sufficiently acceptable level enabling use in actual operation.

After completion of the laser drilling, the process proceeded into a step in which the nickel layers constituting the additional metal layers 6 were peeled off. Herein, a sulfuric acid solution of 600 ml/l in concentration was used at room temperature to immerse the copper clad laminate thereinto and thereby, only the nickel layers constituting the additional metal layers 6 were peeled off without giving any damage on the copper foil layers.

After peeling-off of the additional metal layers 6, formation of interlayer connection layers were performed. The interlayer connection layer formation was conducted such a way that copper layers of 1 to 2 $\mu$m were formed with copper electroless plating and caused to grow to plated copper layers 7 of 10 $\mu$m with copper electroplating. As the copper electroless plating solution at this time, the following solution, which was commonly used, was employed: a concentration of copper (II) sulfate pentahydrate was 0.06 mol/l, a concentration of EDTA 4NaO was 12 mol/l, a concentration of HCHO was 0.5 mol/l, a concentration of 2,2'-dipyridyl was 10 mg/l, a concentration of PEG 1000 was 250 mg/l, a pH value was 12.5, and the electroless plating was conducted using the solution at a liquid temperature of 70° C. for a short time. After the copper electroless plating was finished, the electroplating was conducted using a copper sulfate solution containing sulfuric acid of 150 g/l in concentration and copper of 65 g/l in concentration in conditions for level plating of a liquid temperature of 45° C. and a current density of 15 A/dm$^2$ to attain the copper plating layers 7 each of 10 $\mu$m in thickness.

Thereafter, the laminate 2 was washed with water and dried, and dry films of an ultraviolet-curing type were roll-laminated on surfaces of the external layer copper foils 5 on which the copper plated layers 7 were formed to obtain etching resist layers 8. Thereafter, pattern films were superimposed on the etching resist layers 8, followed by exposure and then developing to leave behind the etching resist layers 8 only in portions where external circuits 9 on both sides were formed. Then, etching was performed with a copper chloride solution to form the external circuits 9 on both sides. For removal of the etching resist layers 8 at the final stage, a sodium hydroxide solution was used to swell and remove the cured etching resist layers 8. In such a way as described above, manufacture of the printed wiring board was enabled.

SECOND EXAMPLE

In this example, description will be given of a manufacturing process for a printed wiring board according to claim 2 using FIGS. 1 to 3. In this example, laser drilling was conducted on a four-layer copper clad laminate 2 to manufacture the printed wiring board 1. As an internal layer core material 3 of the four-layer copper clad laminate 2, a double-sided substrate after internal circuits 4 were formed on both sides was used and copper foils with resin A were disposed on both surfaces of the internal layer core material 3, followed by hot press to thereby achieve a state without the presence of glass cloth in each of spaces between the internal layer core and external layer copper foils 5, which is similar to the process adopted in the first example. Description will be given of the example below.

First of all, cobalt layers were formed as additional metal layers 6 on surfaces of the external layer copper foils 5 of the four-layer copper clad laminate 2. In formation of the additional metal layers 6, an electroplating method was employed in the following way: a cobalt plating solution containing cobalt sulfate and trisodium citrate was used in conditions of a cobalt concentration of 20 g/l and trisodium citrate of 200 g/l in concentration, a liquid temperature of 35° C., a pH value of 3 and a current density of 7 A/dm$^2$ to form the cobalt layer of about 1 μm in thickness.

After formation of the auxiliary layers 6, the laminate 2 was washed with water and surfaces of the additional metal layers 6 were dried, followed by laser drilling. Conditions for the laser drilling were as described in the opening paragraph of this section. A drilled diameter of a formed BVH was of an opening ratio of 100% and a diameter distribution ranged from 105 to 110 μm, thus finishing the drilling at a sufficiently acceptable level enabling use in actual operation.

After completion of the laser drilling, the process proceeded into a step in which the cobalt layers constituting the additional metal layers 6 were peeled off. Herein, a physical polishing was applied to the cobalt layers with a roll buff of # 1000 to remove the layers uniformly.

Steps after removal of the cobalt layers constituting the additional metal layers 6 are similar to those adopted in the first example; therefore, description thereof is omitted. In such a way as described above, manufacture of the printed wiring board was enabled.

THIRD EXAMPLE

In this example, description will be given of a manufacturing process for a printed wiring board 1 according to claim 3 using FIG. 1. In the example, laser drilling was performed on a four-layer copper clad laminate 2 to manufacture the printed wiring board 1. As an internal layer core material 3 of the four-layer copper clad laminate 2, a double-sided substrate after inner circuits 4 were formed was used, copper foils with resin A were disposed on both surfaces of the inner layer core material 3, followed by hot press, to thereby achieve a state without the presence of glass cloth in each of spaces between the internal layer core material and external layer copper foils 5, which is similar to the process adopted in the first example. Description will be given of the example below.

First of all, zinc layers were formed as additional metal layers 6 on surfaces of the external layer copper foils 5 of the four-layer copper clad laminate 2. In formation of the additional metal layers 6, an electroplating method was employed in the following way: a zinc plating solution containing zinc and potassium pyrophosphate was used in conditions of a zinc concentration of 25 g/l and potassium pyrophosphate of 300 g/l in concentration, a liquid temperature of 40° C., a pH value of 10 and a current density of 5 A/dm$^2$ to form the zinc layer of about 1 μm in thickness.

After formation of the additional metal layers 6, the laminate 2 was washed with water and surfaces of the additional metal layers 6 were dried, followed by laser drilling. Conditions for the laser drilling were as described in the opening paragraph of this section. A drilled diameter of a formed BVH was of an opening ratio of 100% and a diameter distribution ranged from 103 to 110 μm, thus finishing the drilling at a sufficiently acceptable level enabling use in actual operation.

After completion of the laser drilling, the process proceeded into a step in which the zinc layers constituting the additional metal layers 6 were peeled off. Herein, a 3% hydrochloric acid solution was used and the four-layer copper clad laminate 2 was immersed in the solution to remove the additional metal layers by etching.

Steps after removal of the zinc layers constituting the additional metal layers 6 are similar to those adopted in the first example; therefore, description thereof is omitted. In such a way as described above, manufacture of the printed wiring board was enabled.

FOURTH EXAMPLE

In this example, description will be given of a manufacturing process for a printed wiring board 1 according to claim 5 using FIGS. 6 to 8. In the example, laser drilling was performed on a four-layer copper clad laminate 2 to manufacture the printed wiring board 1. As an internal layer core material 3 of the four-layer copper clad laminate 2, a double-sided substrate after inner circuits 4 were formed was used, copper foils with resin A were disposed on both surfaces of the inner layer core material 3, followed by hot press, to thereby achieve a state without the presence of glass cloth in each of spaces between the internal layer core material and external layer copper foils 5.

First of all, an acid cleaning for the four-layer copper clad laminate 2 was performed in a bath. This acid cleaning was performed if a necessity arose and in order to improve adhesion of an organic layer 10, herein, the laminate 4 was, in the acid cleaning, immersed in a dilute sulfuric acid solution of 150 g/l in concentration at a liquid temperature of 30° C. for immersion time of 20 sec to remove components of fats and oils attached on external layer copper foils 5 of the four-layer copper clad laminate 2 together with surface oxide films.

After the acid cleaning, the organic layers 10 were formed on the surfaces of the external layer copper foils 5 of the four-layer copper clad laminate 2. Formation of the organic layers 10 were performed by immersing the four-layer copper clad laminate 2 in an aqueous solution including CBTA of 5 g/l in concentration at a liquid temperature of 40° C. and a pH value of 5 for 30 sec.

After the organic layers 10 were formed, followed by washing with water, nickel layers were formed as additional metal layers 6 on the surfaces of the organic layers 10. In formation of the additional metal layers 6, an electroplating method was employed in the following way: a nickel plating solution containing nickel sulfate was used in conditions of a nickel concentration of 20 g/l, a liquid temperature of 35° C., a pH value of 3 and a current density of 8 A/dm$^2$ to form the nickel layer of about 1 μm in thickness.

After formation of the auxiliary layers 6, the laminate 2 was washed with water and surfaces of the additional metal layers 6 were dried, followed by laser drilling. Conditions for the laser drilling were as described in the opening paragraph of this section. A drilled diameter of a formed BVH was of an opening ratio of 100% and a diameter distribution ranged from 104 to 111 μm, thus finishing the drilling at a sufficiently acceptable level enabling use in actual operation.

After completion of the laser drilling, the process proceeded into a step in which the nickel layers constituting the additional metal layers 6 were peeled off. Herein, an operator peeled off the additional metal layers 6 by manual operation using a tape starting the peeling-off at a corner of the copper clad laminate. The additional metal layers, at this time, were able to be peeled off by manual operation with extreme ease and with no residue of a nickel component on the surface of the copper clad laminate either.

Then, interlayer connection layer formation was performed, which was to be conducted after peeling-off of the additional metal layers 6, to form copper plated layers 7 and a process thereafter such as that the laminate was washed with water and dried, and dry films of an ultraviolet-curing type were laminated, followed by exposure, developing and circuit etching was similar to the correspondent process of the first example; therefore, description thereof here is omitted. In such a way as described above, manufacture of the printed wiring board was enabled.

FIFTH EXAMPLE

In this example, description will be given of a manufacturing process for a printed wiring board 1 according to claim 7 using FIGS. 9 to 11. In the example, laser drilling was performed on a four-layer copper clad laminate 2 to manufacture the printed wiring board 1. As an internal layer core material 3 of the four-layer copper clad laminate 2, a double-sided substrate after inner circuits 4 were formed was used, copper foils with resin were disposed on both surfaces of the inner layer core material 3, followed by hot press, to thereby achieve a state without the presence of glass cloth in each of spaces between the internal layer core material and external layer copper foils 5.

First of all, an acid cleaning for the four-layer copper clad laminate 2 was performed in a bath. This acid cleaning was performed if a necessity arose and in order to improve adhesion of an organic layer 10, herein, the laminate 4 was, in the acid cleaning, immersed in a dilute sulfuric acid solution of 150 g/l in concentration at a liquid temperature of 30° C. for immersion time of 20 sec to remove components of fats and oils attached on external layer copper foils 5 of the four-layer copper clad laminate 2 together with surface oxide films.

After the acid cleaning, the organic layers 10 were formed on the surfaces of the external layer copper foils 5 of the four-layer copper clad laminate 2. Formation of the organic layers 10 were performed by immersing the four-layer copper clad laminate 2 in an aqueous solution including CBTA of 5 g/l in concentration at a liquid temperature of 40° C. and a pH value of 5 for 30 sec.

After the organic layers 10 were formed, followed by acid cleaning, nickel layers were formed as additional metal layers 6 on the surfaces of the organic layers 10. In formation of the additional metal layers 6, an electroplating method was employed in the following way: a nickel plating solution containing nickel sulfate was used in conditions of a nickel concentration of 20 g/l, a liquid temperature of 35° C., a pH value of 3 and a current density of 8 A/dm$^2$ to form the nickel layer of about 1 μm in thickness.

After formation of the auxiliary layers 6, the laminate 2 was washed with water and surfaces of the additional metal layers 6 were dried, followed by laser drilling. Conditions for the laser drilling were as described in the opening paragraph of this section. A drilled diameter of a formed BVH was of an opening ratio of 100% and a diameter distribution ranged from 105 to 111 μm, thus finishing the drilling at a sufficiently acceptable level enabling use in actual operation.

After completion of the laser drilling, formation of interlayer connection layers was conducted at this stage. The interlayer connection layer formation was conducted such a way that copper layers of 1 to 2 μm were formed with copper electroless plating and caused to grow to plated copper layers 7 of 10 μm with copper electroplating. The copper electroless plating solution at this time was a solution, which was commonly used, including: copper (II) sulfate pentahydrate of 0.06 mol/l in concentration, EDTA 4NaO of 12 mol/l in concentration, HCHO of 0.5 mol/l in concentration, 2,2'-dipyridyl of 10 mg/l in concentration and PEG 1000 of 250 mg/l in concentration, and a pH value of the solution was 12.5, and the electroless plating was conducted at a liquid temperature of 70° C. for a short time using the plating solution. After the copper electroless plating was finished, the electroplating was conducted using a copper sulfate solution including sulfuric acid of 150 g/l in concentration and copper of 65 g/l in concentration in conditions for level plating of a liquid temperature of 45° C. and a current density of 15 A/dm$^2$ to attain the copper plating layers 7 each of 10 μm thick.

After formation of the interlayer connection layers, the nickel layers constituting the additional metal layers 6 were peeled off. Herein, an operator peeled off each of the additional metal layers 6 by manual operation starting at a corner of the copper clad laminate. Each of the copper plated layers 7 formed on the surfaces of the additional metal layers 6 were peeled off simultaneously together with the additional metal layers 6, leaving behind part of a copper plated layer 7 only on the inner wall surface of BHV. A peeling strength of the additional metal layers at this time was a value of 80.6 g/cm low enough to peel off each layer with ease because of addition of a load corresponding to a bending stress in the copper plated layer 7 and the peeling-off was performed without leaving residue of a nickel component on the surfaces of the copper clad laminate.

A process after peeling-off of the additional metal layers 6 such as that the laminate was washed with water and dried, and dry films of an ultraviolet-curing type were laminated, followed by exposure, developing and circuit etching was similar to that of the first example; therefore, description thereof here is omitted. In such a way as described above, manufacture of the printed wiring board was enabled.

EFFECT OF THE INVENTION

By using a manufacturing process for a printed wiring board relating to the present invention, laser drilling, which was said to be difficult in application, has been enabled in a process that carbon laser light is employed to remove a copper foil and resin as a substrate material simultaneously, thereby forming a hole. By using a manufacturing process for a printed wiring board relating to the present invention, no necessity arises for removal of a copper foil in a portion in which laser drilling is performed in advance like a prior art conformal mask lithography but a prior art etching process can be applied as it was, which leads to great reduction in capital investment, thereby enabling not only reduction in a total manufacture cost of a printed wiring board but also supply of low cost products into the market.

What is claimed is:

1. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising the steps of:

forming a nickel layer as an additional metal layer of 0.08 to 2 $\mu$m in thickness on a surface of said copper foil residing in an external layer of said copper clad laminate;

irradiating a surface of said nickel layer with said laser light at a prescribed position where said through hole or said hole such as IVH, BVH or the like is to be formed in said copper clad laminate to thereby remove said nickel layer, said copper foil and said resin layer as a substrate material simultaneously into a desired shape;

using an etching method and a physical polishing method, singly or in combination, to remove said nickel layer as a surface layer of said copper clad laminate after the laser drilling;

performing interlayer connection layer formation to obtain interlayer connection in said copper clad laminate from which said nickel layer is removed; and forming an etching resist layer on a surface of said copper clad laminate after copper plating, followed by exposure, development, circuit etching, and etching resist removal.

2. The manufacturing process for a printed wiring board according to claim 1, characterized in that an etching solution for use in dissolution of said nickel layer is a selective etching solution not dissolving copper and one of the following solutions is used as said etching solution:

(1) a sulfuric acid solution of sulfuric acid and nitric acid; and (2) a mixed acid solution of sulfuric acid and nitric acid; and (3) a mixed solution of sulfuric acid, m-nitrobenzenesulfonic acid.

3. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising the steps of:

forming a cobalt layer as an additional metal layer of 0.05 to 3 $\mu$m in thickness on a surface of said copper foil residing in an external layer of said copper clad laminate;

irradiating a surface of said cobalt layer with said laser light at a prescribed position where said through hole or said hole such as IVH, BVH or the like is to be formed in said copper clad laminate to thereby remove said cobalt layer, said copper foil and said resin layer as a substrate material simultaneously into a desired shape;

using an etching method and a physical polishing method, singly or in combination, to remove said cobalt layer as a surface layer of said cooper clad laminate after the laser drilling;

performing interlayer connection layer formation to obtain interlayer connection in said copper clad laminate from which said cobalt layer is removed; and forming an etching resist layer on a surface of said copper clad laminate after copper plating, after copper plating, followed by exposure, development, circuit etching, and etching resist removal.

4. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising the steps of:

forming a zinc layer as an additional metal layer of 0.03 to 2 $\mu$m in thickness on a surface of said copper foil residing in an external layer of said copper clad laminate;

irradiating a surface of said zinc layer with said laser light at a prescribed position where said through hole or said hole such as IVH, BVH or the like is to be formed in said copper clad laminate to thereby remove said zinc layer, said copper foil and said resin layer as a substrate material simultaneously into a desired shape;

using an etching method and a physical polishing method, singly or in combination, to remove said zinc layer as a surface layer of said copper clad laminate after the laser drilling;

performing interlayer connection layer formation to obtain interlayer connection in said copper clad laminate from which said zinc layer is removed; and forming an etching resist layer on a surface of said copper clad laminate after copper plating, followed by exposure, development, circuit etching, and etching resist removal.

5. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, comprising in order the steps of:

a. forming an organic layer on a surface of said copper foil residing in an external layer of said copper clad laminate;

b. forming a nickel layer as an additional metal layer of 0.08 to 2 $\mu$m in thickness on a surface of said organic layer;

c. irradiating a surface of said nickel layer with said laser light at a prescribed position where said through hole or said hole such as IVH, BVH, or the like is to be formed in said copper clad laminate to thereby remove said nickel layer, said organic layer, said copper foil and said resin layer as a substrate material simultaneously into a desired shape;

d. removing said nickel layer from a surface of said copper clad laminate by peeling;

e. performing interlayer connection layer formation to obtain interlayer connection in the copper clad laminate; and f. forming an etching resist layer on said surface of said copper clad laminate after copper plating, followed by exposure, development, circuit etching, and etching resist removal.

6. The manufacturing process for a printed wiring board according to claim 5, characterized in that said organic layer is formed with one or two selected from the group consisting of nitrogen-containing organic compounds, sulfur-containing organic compounds and carboxylic acids.

7. The manufacturing process for a printed wiring board according to claim 5, characterized in that said organic layer is formed by repeatedly applying an organic agent constituted of one or constituted as a mixture of two or more selected from the group consisting of nitrogen-containing organic compounds, sulfur-containing organic compounds and carboxylic acids several times.

8. The manufacturing process for a printed wiring board according to claim 5, characterized in that said organic layer is formed by alternately applying two organic agents or more selected from the group consisting of nitrogen-containing organic compounds, sulfur-containing organic compounds and carboxylic acids several time.

9. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising in order the steps of:

a. forming an organic layer on a surface of said copper foil residing in an external layer of said copper clad laminate;

b. forming a cobalt layer as an additional metal layer of 0.05 to 3 $\mu$m in thickness on a surface of said organic layer;

c. irradiating a surface of said cobalt layer with said laser light at a prescribed position where said through hole or said hole such as IVH, BVH, or the like is to be formed in said copper clad laminate to thereby remove said cobalt layer, said organic layer, said copper foil and said resin layer as a substrate material simultaneously into a desired shape;

d. removing said cobalt layer from a surface of said copper clad laminate by peeling;

e. performing interlayer connection layer formation to obtain interlayer connection in the copper clad laminate; and f. forming an etching resist layer on said surface of said copper clad laminate after copper plating, followed by exposure, development, circuit etching, and etching resist removal.

10. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising in order the steps of:

a. forming an organic layer on a surface of said copper foil residing in an external layer of said copper clad laminate;

b. forming a nickel layer as an additional metal layer of 0.08 to 2 $\mu$m in thickness on a surface of said organic layer;

c. irradiating a surface of said nickel layer with said laser light at a prescribed position where said through hole or said hole such as IVH, BVH, or the like is to be formed in said copper clad laminate to thereby remove said nickel layer, said organic layer, said copper foil and said resin layer as a substrate material simultaneously into a desired shape;

d. performing interlayer connection layer formation to obtain interlayer connection in the copper clad laminate;

e. removing said nickel layer from a surface of said copper clad laminate by peeling;

f. forming an etching resist layer on said surface of said copper clad laminate after removal of said nickel layer, followed by exposure, development, circuit etching, and etching resist removal.

11. A manufacturing process for a printed wiring board in which a copper clad laminate obtained by bonding a copper foil on resin as a substrate material is irradiated with carbon dioxide laser light to form a through hole or a hole such as IVH, BVH or the like therein and interlayer connection layer formation is performed, followed by performing circuit formation, characterized by comprising in order the steps of:

a. forming an organic layer on a surface of said copper foil residing in an external layer of said copper clad laminate;

b. forming a cobalt layer as an additional metal layer of 0.05 to 3 $\mu$m in thickness on a surface of said organic layer;

c. irradiating a surface of said cobalt layer with said laser light at a prescribed position where said through hole or said hole such as IVH, BVH, or the like is to be formed in said copper clad laminate to thereby remove said cobalt layer, said organic layer, said copper foil and said resin layer as a substrate material simultaneously into a desired shape;

d. performing interlayer connection layer formation to obtain interlayer connection in the copper clad laminate;

e. removing said cobalt layer from a surface of said copper clad laminate by peeling; and f. forming an etching resist layer on said surface of said copper clad laminate after removal of said cobalt layer, followed by exposure, development, circuit etching, and etching resist removal.

\* \* \* \* \*